US011314174B2

(12) United States Patent
De Winter et al.

(10) Patent No.: US 11,314,174 B2
(45) Date of Patent: Apr. 26, 2022

(54) METHODS AND PATTERNING DEVICES AND APPARATUSES FOR MEASURING FOCUS PERFORMANCE OF A LITHOGRAPHIC APPARATUS, DEVICE MANUFACTURING METHOD

(71) Applicant: ASML Netherlands B.V., Veldhoven (NL)

(72) Inventors: Laurentius Cornelius De Winter, Vessem (NL); Roland Pieter Stolk, Sprang-Capelle (NL); Frank Staals, Eindhoven (NL); Anton Bernhard Van Oosten, Lommel (BE); Paul Christiaan Hinnen, Veldhoven (NL); Marinus Jochemsen, Veldhoven (NL); Thomas Theeuwes, Veldhoven (NL); Eelco Van Setten, Waalre (NL)

(73) Assignee: ASML Netherlands B.V., Veldhoven (NL)

( * ) Notice: Subject to any disclaimer, the term of this patent is extended or adjusted under 35 U.S.C. 154(b) by 112 days.

(21) Appl. No.: 16/645,672

(22) PCT Filed: Aug. 3, 2018

(86) PCT No.: PCT/EP2018/071103
§ 371 (c)(1),
(2) Date: Mar. 9, 2020

(87) PCT Pub. No.: WO2019/048147
PCT Pub. Date: Mar. 14, 2019

(65) Prior Publication Data

US 2020/0264522 A1 Aug. 20, 2020

(30) Foreign Application Priority Data

Sep. 11, 2017 (EP) .................................... 17190433
Mar. 6, 2018 (EP) .................................... 18160202
Jul. 16, 2018 (EP) .................................... 18183603

(51) Int. Cl.
*G03F 7/20* (2006.01)
*G03F 1/24* (2012.01)
*G03F 1/44* (2012.01)

(52) U.S. Cl.
CPC ............ *G03F 7/70641* (2013.01); *G03F 1/24* (2013.01); *G03F 1/44* (2013.01); *G03F 7/702* (2013.01); *G03F 7/70283* (2013.01)

(58) Field of Classification Search
CPC .. G03F 7/70641; G03F 7/702; G03F 7/70233; G03F 7/70283; G03F 7/703;
(Continued)

(56) References Cited

U.S. PATENT DOCUMENTS 5,399,448 A * 3/1995 Nagata .................. B82Y 10/00 430/5
6,645,679 B1 11/2003 La Fontaine et al.
(Continued)

FOREIGN PATENT DOCUMENTS

WO WO 2013/178422 A1 12/2013
WO WO 2019/001873 A1 1/2019

OTHER PUBLICATIONS

International Search Report and Written Opinion of the International Searching Authority directed to International Application No. PCT/EP2018/071103, dated Dec. 3, 2018; 11 pages.

*Primary Examiner* — Christina A Riddle
(74) *Attorney, Agent, or Firm* — Sterne, Kessler, Goldstein & Fox P.L.L.C.

(57) ABSTRACT

Disclosed is a method of measuring focus performance of a lithographic apparatus, and corresponding patterning device and lithographic apparatus. The method comprises using the lithographic apparatus to print one or more first printed structures and second printed structures. The first printed
(Continued)

structures are printed by illumination having a first non-telecentricity and the second printed structures being printed by illumination having a second non-telecentricity, different to said first non-telecentricity. A focus dependent parameter related to a focus-dependent positional shift between the first printed structures and the second printed structures on said substrate is measured and a measurement of focus performance based at least in part on the focus dependent parameter is derived therefrom.

12 Claims, 8 Drawing Sheets

(58) Field of Classification Search
CPC .. G03F 7/70483; G03F 7/70491; G03F 7/705; G03F 7/70516; G03F 7/7055; G03F 7/70591; G03F 7/70616; G03F 7/70666; G03F 7/70675; G03F 7/70683; G03F 1/22; G03F 1/38; G03F 1/44; G03F 9/7023; G03F 9/7026; G03F 9/7073; G03F 9/7076; G03F 9/7084; G03F 9/7092; G03F 1/24; G21K 1/062; G21K 2201/064
USPC ..... 355/30, 52–55, 67–77; 250/492.1, 492.2, 250/492.22, 493.1, 505.1, 548, 504 r; 430/5, 22, 30, 311, 322; 356/609, 624
See application file for complete search history.

(56) References Cited

U.S. PATENT DOCUMENTS 9,454,072 B2 9/2016 Levinski et al.
2006/0033921 A1 2/2006 Den Boef et al.
2008/0076035 A1 3/2008 Yan
2010/0201963 A1 8/2010 Cramer et al.
2010/0328655 A1 12/2010 Den Boef
2011/0027704 A1 2/2011 Cramer et al.
2011/0043791 A1 2/2011 Smilde et al.
2011/0069292 A1 3/2011 Den Boef
2011/0102753 A1 5/2011 Van De Kerkhof et al.
2012/0044470 A1 2/2012 Smilde et al.
2012/0123581 A1 5/2012 Smilde et al.
2013/0003031 A1 1/2013 Hofmans et al.
2013/0040230 A1* 2/2013 Spaziani ................. G03F 7/703 430/5
2013/0258310 A1 10/2013 Smilde et al.
2013/0271740 A1 10/2013 Quintanilha
2014/0218714 A1* 8/2014 Hsu ..................... G03F 7/70283 355/77
2014/0313496 A1* 10/2014 Gijsbertsen ........... G03F 9/7026 355/55
2016/0033879 A1 2/2016 Raghunathan et al.
2018/0149959 A1* 5/2018 Lin ....................... G03F 7/2004

* cited by examiner (a)

(b)

METHODS AND PATTERNING DEVICES AND APPARATUSES FOR MEASURING FOCUS PERFORMANCE OF A LITHOGRAPHIC APPARATUS, DEVICE MANUFACTURING METHOD

CROSS-REFERENCE TO RELATED APPLICATIONS

This application claims priority of EP application 17190433.7 which was filed on Sep. 11, 2017, EP application 18160202.0 which was filed on Mar. 6, 2018 and EP application 18183603.2 which was filed on Jul. 16, 2017 which are incorporated herein in its entirety by reference.

FIELD OF THE INVENTION

The present invention relates to inspection apparatus and methods usable, for example, to perform metrology in the manufacture of devices by lithographic techniques. The invention further relates to such methods for monitoring a focus parameter in a lithographic process.

BACKGROUND ART

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

In lithographic processes, it is desirable frequently to make measurements of the structures created, e.g., for process control and verification. Various tools for making such measurements are known, including scanning electron microscopes, which are often used to measure critical dimension (CD), and specialized tools to measure overlay, the accuracy of alignment of two layers in a device. Recently, various forms of scatterometers have been developed for use in the lithographic field. These devices direct a beam of radiation onto a target and measure one or more properties of the scattered radiation—e.g., intensity at a single angle of reflection as a function of wavelength; intensity at one or more wavelengths as a function of reflected angle; or polarization as a function of reflected angle—to obtain a diffraction "spectrum" from which a property of interest of the target can be determined.

Examples of known scatterometers include angle-resolved scatterometers of the type described in US2006033921A1 and US2010201963A1. The targets used by such scatterometers are relatively large, e.g., 40 μm by 40 μm, gratings and the measurement beam generates a spot that is smaller than the grating (i.e., the grating is underfilled). Diffraction-based overlay metrology using dark-field imaging of the diffraction orders enables measurement of overlay and other parameters on smaller targets. These targets can be smaller than the illumination spot and may be surrounded by product structures on a substrate. The intensities from the environment product structures can efficiently be separated from the intensities from the overlay target with the dark-field detection in the image-plane.

Examples of dark field imaging metrology can be found in international patent applications US20100328655A1 and US2011069292A1 which documents are hereby incorporated by reference in their entirety. Further developments of the technique have been described in published patent publications US20110027704A, US20110043791A, US2011102753A1, US20120044470A, US20120123581A, US20130258310A, US20130271740A and WO2013178422A1. These targets can be smaller than the illumination spot and may be surrounded by product structures on a wafer. Multiple gratings can be measured in one image, using a composite grating target. The contents of all these applications are also incorporated herein by reference.

One important parameter of a lithographic process which requires monitoring is focus. There is a desire to integrate an ever-increasing number of electronic components in an IC. To realize this, it is necessary to decrease the size of the components and therefore to increase the resolution of the projection system, so that increasingly smaller details, or line widths, can be projected on a target portion of the substrate. As the critical dimension (CD) in lithography shrinks, consistency of focus, both across a substrate and between substrates, becomes increasingly important. CD is the dimension of a feature or features (such as the gate width of a transistor) for which variations will cause undesirable variation in physical properties of the feature.

Traditionally, optimal settings were determined by "send-ahead wafers" i.e. substrates that are exposed, developed and measured in advance of a production run. In the send-ahead wafers, test structures were exposed in a so-called focus-energy matrix (FEM) and the best focus and energy (exposure dose) settings were determined from examination of those test structures. More recently, focus metrology targets are included in the production designs, to allow continuous monitoring of focus performance. These metrology targets should permit rapid measurements of focus, to allow fast performance measurement in high-volume manufacturing. Ideally, the metrology targets should be small enough that they can be placed among the product features without undue loss of space.

Current test structure designs and focus measuring methods have a number of drawbacks. Known focus metrology targets require sub-resolution features and/or grating structures with large pitches. Such structures may contravene design rules of the users of lithographic apparatuses. Asymmetry in a grating structure can be measured effectively using high-speed inspection apparatus such as a scatterometer, working at visible radiation wavelengths. Known focus measuring techniques exploit the fact that focus-sensitive asymmetry can be introduced into structures printed in a resist layer by special design of the patterns on a patterning device that defines the target structure. For EUV lithography, where printing is performed using radiation of a wavelength less than 20 nm, for example 13.5 nm, the creation of sub-resolution features becomes even more difficult. For EUV lithography, resist thickness, and therefore the thickness of target structures, is smaller. This weakens the diffraction efficiency, and hence the signal strength, available for focus metrology.

For these reasons, there is a need to develop new techniques for the measurement of focus performance in lithographic processes, particularly in EUV lithography, but also for projection-based lithography in general.

SUMMARY OF THE INVENTION

The present invention aims to provide alternative methods of measuring focus performance. In some aspects the invention aims to provide methods that are adaptable to new environments, such as EUV lithography. In some aspects, the invention aims to avoid the requirement for sub-resolution features to be defined in a patterning device.

The invention in a first aspect provides a method of measuring focus performance of a lithographic apparatus, the method comprising: (a) printing one or more printed structures on a substrate using the lithographic apparatus, said one or more printed structures comprising first printed structures and second printed structures, said first printed structures being printed by illumination having a first non-telecentricity (i.e., at the substrate level) and said second printed structures being printed by illumination having a second non-telecentricity (i.e., at the substrate level), different to said first non-telecentricity; (b) measuring a focus dependent parameter related to a focus-dependent positional shift between said one or more first printed structures and said one or more second printed structures on said substrate; and (c) deriving a measurement of focus performance based at least in part on the focus dependent parameter measured in step (b.

The invention in a second aspect provides a reflective patterning device comprising one or more first reticle structures and one or more second reticle structures which are such that a first non-telecentricity induced by said first reticle structures is different to a second non-telecentricity induced by said second reticle structures.

The invention in a third aspect provides a reticle blank comprising a reticle substrate being provided with a configuration of alternating hard mask and absorber layers, wherein a first type of hard mask layer is alternated with a second type of hard mask layer, the first type of hard mask layer having a different etch characteristic from the second type of hard mask layer.

The invention in a fourth aspect provides a method of manufacturing a reticle comprising at least two classes of reticle features, the method comprising: obtaining a reticle blank according to the third aspect of the invention; patterning a first hard mask layer; etching a first absorber layer; patterning a second hard mask layer; and etching a second absorber layer, wherein a first class of reticle features is associated with the patterning of the first hard mask layer and a first absorber thickness and a second class of reticle features is associated with the patterning of the second hard mask layer and a second absorber thickness being smaller than the first absorber thickness.

The invention in a fifth aspect provides a reticle comprising a first class of reticle features having a first absorber thickness and a second class of reticle features having a second absorber thickness being smaller than the first absorber thickness.

The invention in a sixth aspect provides a reticle blank comprising a reticle substrate and an EUV reflecting layer characterized in that the reticle blank further comprises a material locally provided between the reticle substrate and the EUV reflecting layer, wherein the material is suitable to create a difference in elevation between a first area of the reticle blank and a second area of the reticle blank.

The invention in a seventh aspect provides a method of determining the focus performance of a lithographic apparatus, the method comprising: obtaining first measurement data associated with one or more first features on a substrate patterned by the lithographic apparatus using the reticle according to the fifth aspect of the invention, the first features associated with the first class of reticle features; obtaining second measurement data associated with one or more second features on the substrate patterned by the lithographic apparatus using the reticle according to the fifth aspect of the invention, the second features associated with the second class of reticle features; and determining the focus setting based on the first and second measurement data.

The invention in an eighth aspect provides a reticle blank comprising a reticle substrate and an EUV reflecting layer characterized in that the reticle blank further comprises a locally provided material between the reticle substrate and the EUV reflecting layer, wherein the material is suitable for creating a difference in elevation between a first area of the reticle blank and a second area of the reticle blank.

The invention in a ninth aspect provides a method of determining focus performance of a lithographic apparatus, the method comprising: obtaining first measurement data associated with one or more first features on a substrate patterned by the lithographic apparatus using the reticle according to an aspect of the invention, the first features associated with the first class of reticle features; obtaining second measurement data associated with one or more second features on the substrate patterned by the lithographic apparatus using the reticle according to an aspect of the invention, the second features associated with the second class of reticle features; and determining the focus setting based on the first and second measurement data.

The invention yet further provides computer program products for use in implementing methods and apparatuses according to various aspects of the first aspect of the invention as set forth above.

The invention yet further provides a method of manufacturing devices using the method according to the first aspect of the invention as set forth above.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF EXEMPLARY EMBODIMENTS

Before describing embodiments of the invention in detail, it is instructive to present an example environment in which embodiments of the present invention may be implemented.

Figure 1:
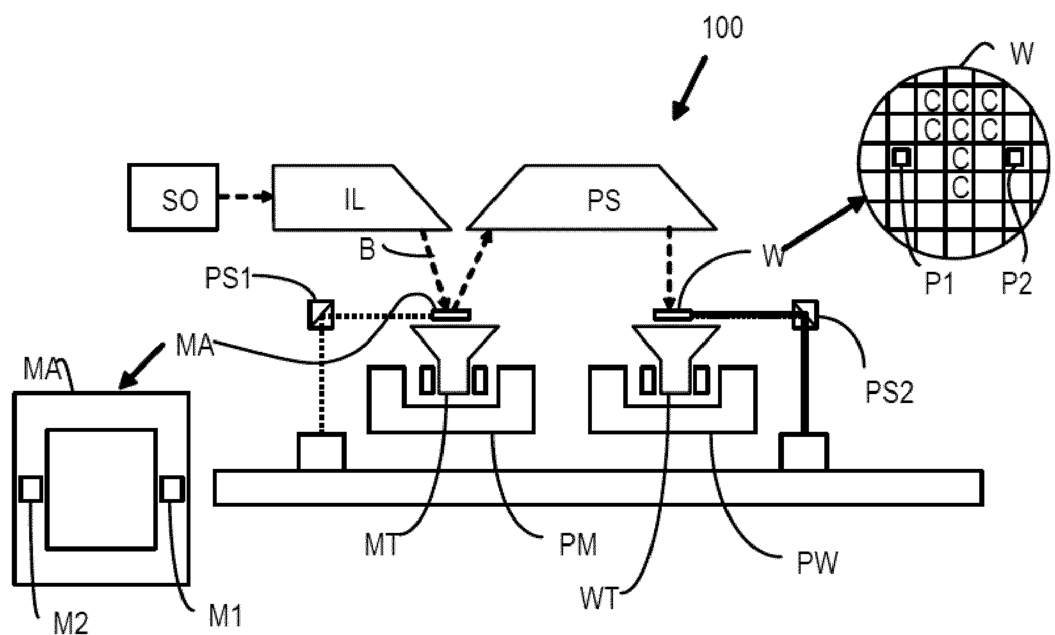
FIG. 1 depicts a lithographic apparatus having a reflective patterning device.

FIG. 1 schematically depicts a lithographic apparatus 100 including a source module SO according to one embodiment of the invention. The apparatus comprises:

- an illumination system (illuminator) IL configured to condition a radiation beam B (e.g. EUV radiation).
- a support structure (e.g. a mask table) MT constructed to support a patterning device (e.g. a mask or a reticle) MA and connected to a first positioner PM configured to accurately position the patterning device;
- a substrate table (e.g. a wafer table) WT constructed to hold a substrate (e.g. a resist-coated wafer) W and connected to a second positioner PW configured to accurately position the substrate; and
- a projection system (e.g. a reflective projection system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

In general patterning devices used in lithography may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since other gases may absorb too much radiation. A vacuum environment may therefore be provided to the whole beam path with the aid of a vacuum wall and vacuum pumps.

As here depicted, the apparatus is of a reflective type (e.g. employing a reflective mask). The focus metrology techniques of the present disclosure have been developed particularly for use with reflective patterning devices (reticles), where illumination is not in a direction normal to a plane of the patterning device surface, but at a slightly oblique angle. In principle, the same techniques could apply in relation to a transmissive patterning device, if for some reason illumination introduced asymmetry. Conventionally, illumination of the reticle is designed to be symmetrical, but with reflective reticles, that is not generally possible.

Certain embodiments of the present disclosure exploit asymmetry in the projection system using a reflective patterning device. Other embodiments are applicable with any kind of projection system.

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives an extreme ultra violet radiation beam from the source module SO. Methods to produce EUV light include, but are not necessarily limited to, converting a material into a plasma state that has at least one element, e.g., xenon, lithium or tin, with one or more emission lines in the EUV range. In one such method, often termed laser produced plasma ("LPP") the required plasma can be produced by irradiating a fuel, such as a droplet, stream or cluster of material having the required line-emitting element, with a laser beam. The source module SO may be part of an EUV radiation system including a laser, not shown in FIG. 1, for providing the laser beam exciting the fuel. The resulting plasma emits output radiation, e.g., EUV radiation, which is collected using a radiation collector, disposed in the source module. The laser and the source module may be separate entities, for example when a CO2 laser is used to provide the laser beam for fuel excitation.

In such cases, the laser is not considered to form part of the lithographic apparatus and the radiation beam is passed from the laser to the source module with the aid of a beam delivery system comprising, for example, suitable directing mirrors and/or a beam expander. In other cases the source may be an integral part of the source module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using mask alignment marks M1, M2 and substrate alignment marks P1, P2.

The depicted apparatus could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.
2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.
3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

It will be understood that the lithographic apparatus is represented in FIG. 1 in a highly schematic form, but that is all that is necessary for the present disclosure.

Figure 2:
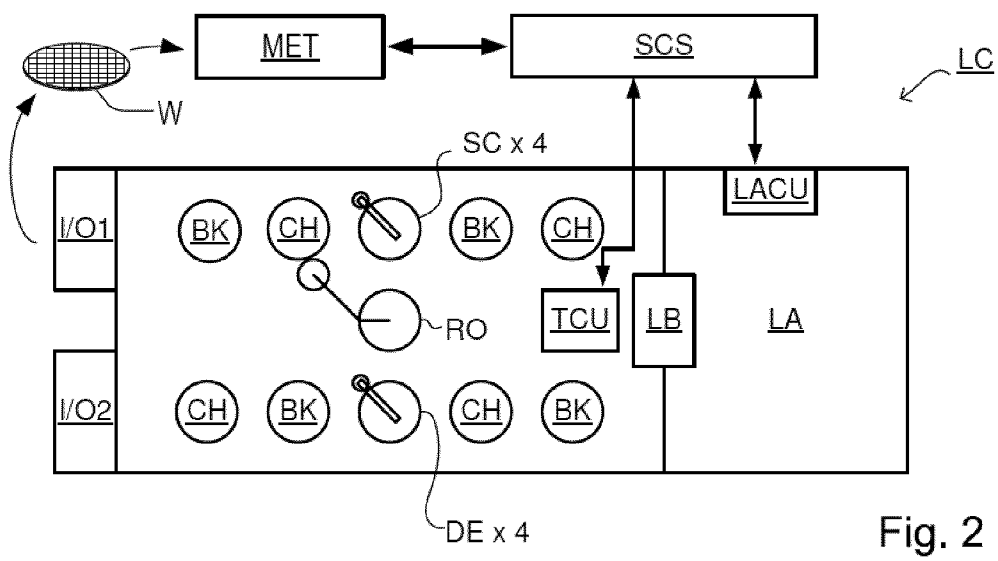
FIG. 2 depicts a lithographic cell or cluster in which a lithographic apparatus and metrology apparatus can be used to perform methods according to the present invention.

As shown in FIG. 2, the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. Accordingly, a manufacturing facility in which lithocell LC is located also includes metrology system MET which receives some or all of the substrates W that have been processed in the lithocell. Metrology results are provided directly or indirectly to the supervisory control system SCS. If errors are detected, adjustments may be made to exposures of subsequent substrates, especially if the inspection can be done soon and fast enough that other substrates of the same batch are still to be exposed. Also, already exposed substrates may be stripped and reworked to improve yield, or discarded, thereby avoiding performing further processing on substrates that are known to be faulty. In a case where only some target portions of a substrate are faulty, further exposures can be performed only on those target portions which are good.

Within metrology system MET, an inspection apparatus is used to determine the properties of the substrates, and in particular, how the properties of different substrates or different layers of the same substrate vary from layer to layer. The inspection apparatus may be integrated into the lithographic apparatus LA or the lithocell LC or may be a stand-alone device. To enable most rapid measurements, it is desirable that the inspection apparatus measure properties in the exposed resist layer immediately after the exposure. However, the latent image in the resist has a very low contrast—there is only a very small difference in refractive index between the parts of the resist which have been exposed to radiation and those which have not—and not all inspection apparatuses have sufficient sensitivity to make useful measurements of the latent image. Therefore, measurements may be taken after the post-exposure bake step (PEB) which is customarily the first step carried out on exposed substrates and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of faulty substrates but may still provide useful information.

Figure 3:
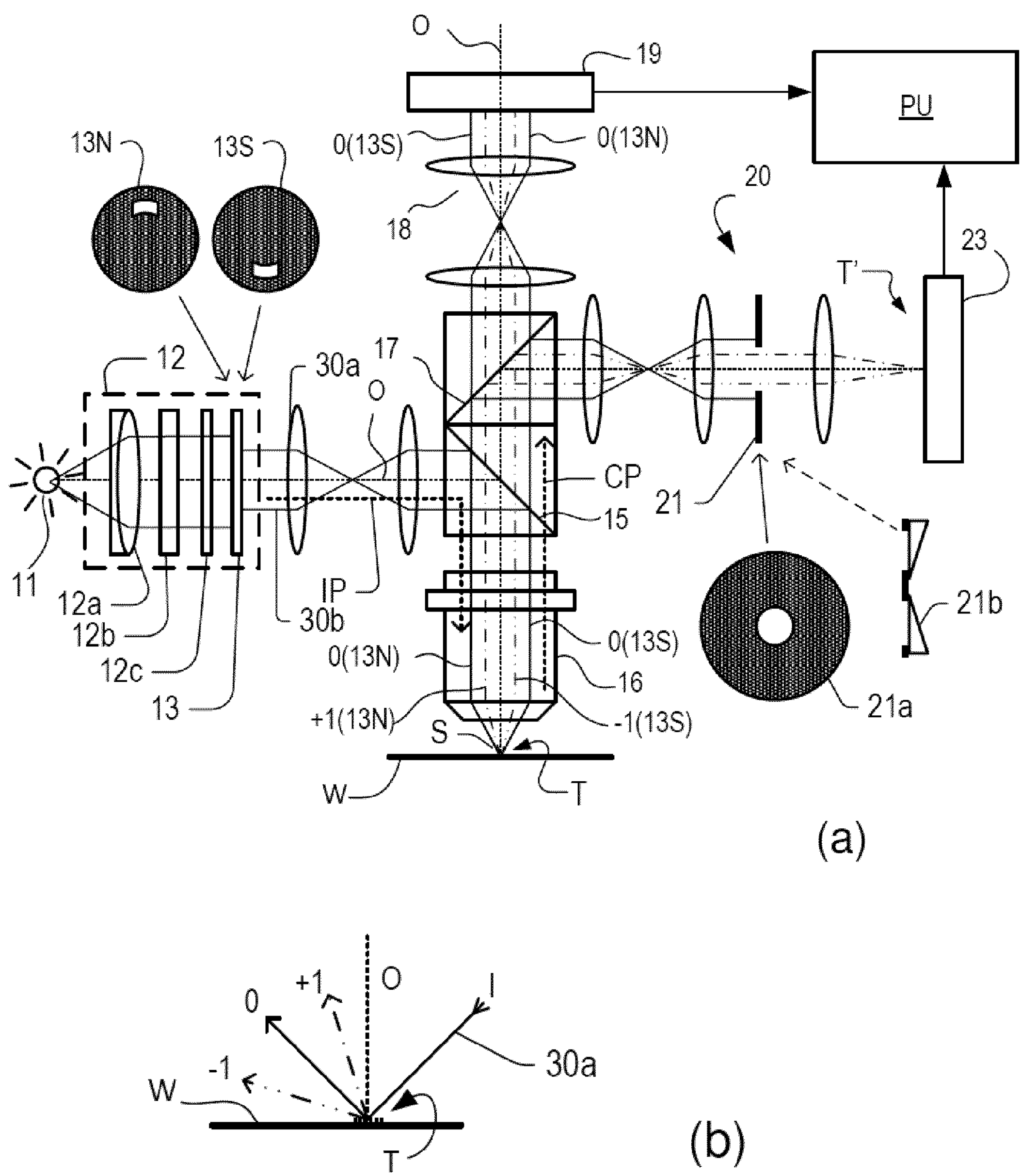
FIG. 3 illustrates schematically an inspection apparatus adapted to perform angle-resolved scatterometry and dark-field imaging inspection methods.

FIG. 3(*a*) shows schematically the key elements of an inspection apparatus implementing so-called dark-field imaging metrology. The apparatus may be a stand-alone device or incorporated in either the lithographic apparatus LA, e.g., at the measurement station, or the lithographic cell LC. An optical axis, which has several branches throughout the apparatus, is represented by a dotted line O. A target grating structure T and diffracted rays are illustrated in more detail in FIG. 3(*b*).

As described in the prior applications cited in the introduction, the dark-field imaging apparatus of FIG. 3(*a*) may be part of a multi-purpose angle-resolved scatterometer that may be used instead of or in addition to a spectroscopic scatterometer. In this type of inspection apparatus, radiation emitted by a radiation source 11 is conditioned by an illumination system 12. For example, illumination system 12 may include a collimating lens system 12*a*, a color filter 12*b*, a polarizer 12*c* and an aperture device 13. The conditioned radiation follows an illumination path IP, in which it is reflected by partially reflecting surface 15 and focused into a spot S on substrate W via a microscope objective lens 16. A metrology target T may be formed on substrate W. Lens 16, has a high numerical aperture (NA), preferably at least 0.9 and more preferably at least 0.95 Immersion fluid can be used to obtain with numerical apertures over 1 if desired.

The objective lens 16 in this example serves also to collect radiation that has been scattered by the target. Schematically, a collection path CP is shown for this returning radiation. The multi-purpose scatterometer may have two or more measurement branches in the collection path. The illustrated example as a pupil imaging branch comprising pupil imaging optical system 18 and pupil image sensor 19. An imaging branch is also shown, which will be described in more detail below. Beamsplitter 17 may divide the collected radiation between the two branches. Additionally, further optical systems and branches will be included in a practical apparatus, for example to collect reference radiation for intensity normalization, for coarse imaging of capture targets, for focusing and so forth. Details of these can be found in the prior publications mentioned above.

Where a metrology target T is provided on substrate W, this may be a 1-D grating, which is printed such that after development, the bars are formed of solid resist lines. The target may be a 2-D grating, which is printed such that after development, the grating is formed of solid resist pillars or vias in the resist. The bars, pillars or vias may alternatively be etched into the substrate. Each of these gratings is an example of a target structure whose properties may be investigated using the inspection apparatus.

The various components of illumination system 12 can be adjustable to implement different metrology 'recipes' within the same apparatus. In addition to selecting wavelength (color) and polarization as characteristics of the illuminating radiation, illumination system 12 can be adjusted to implement different illumination profiles. The plane of aperture device 13 is conjugate with a pupil plane of objective lens 16 and the plane of the pupil image detector 19. Therefore, an illumination profile defined by aperture device 13 defines the angular distribution of light incident on substrate W in spot S. To implement different illumination profiles, an aperture device 13 can be provided in the illumination path. The aperture device may comprise different apertures mounted on a movable slide or wheel. It may alternatively comprise a programmable spatial light modulator. As a further alternative, optical fibers may be disposed at different location in the illumination pupil plane and used selectively to deliver light or not deliver light at their respective locations. These variants are all discussed and exemplified in the documents cited above.

In a first example illumination mode, aperture 13N is used and rays 30*a* are provided so that the angle of incidence is as shown at 'I' in FIG. 3(*b*). The path of the zero order ray reflected by target T is labeled '0' (not to be confused with optical axis 'O'). In a second illumination mode, aperture 13S is used, so that rays 30*b* can be provided, in which case the angles of incidence and reflection will be swapped compared with the first mode. In FIG. 3(*a*), the zero order rays of the first and second example illumination modes are labeled 0(13N) and 0(13S) respectively. Both of these illumination modes will be recognized as off-axis illumination modes. Many different illumination modes, including on-axis illumination modes can be implemented for different purposes.

As shown in more detail in FIG. 3(*b*), target grating T as an example of a target structure is placed with substrate W normal to the optical axis O of objective lens 16. In the case of an off-axis illumination profile, a ray of illumination I impinging on grating T from an angle off the axis O gives rise to a zeroth order ray (solid line 0) and two first order rays (dot-chain line +1 and double dot-chain line −1). It should be remembered that with an overfilled small target grating, these rays are just one of many parallel rays covering the area of the substrate including metrology target grating T and other features. Since the beam of illuminating rays 30*a* has a finite width (necessary to admit a useful quantity of light), the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown.

In the branch of the collection path for dark-field imaging, imaging optical system 20 forms an image T' of the target on the substrate W on sensor 23 (e.g. a CCD or CMOS sensor). An aperture stop 21 is provided in a plane in the imaging branch of the collection path CP which is conjugate to a pupil plane of objective lens 16. Aperture stop 21 may also be called a pupil stop. Aperture stop 21 can take different forms, just as the illumination aperture can take different forms. The aperture stop 21, in combination with the effective aperture of lens 16, determines what portion of the scattered radiation is used to produce the image on sensor 23. Typically, aperture stop 21 functions to block the zeroth order diffracted beam so that the image of the target formed on sensor 23 is formed only from the first order beam(s). In an example where both first order beams are combined to form an image, this would be the so-called dark field image, equivalent to dark-field microscopy. As an example of an aperture stop 21, aperture 21*a* can be used which allows passage of on-axis radiation only. Using off-axis illumination in combination with aperture 21*a*, only one of the first orders is imaged at a time.

The images captured by sensor 23 are output to image processor and controller PU, the function of which will depend on the particular type of measurements being performed. For the present purpose, measurements of asymmetry of the target structure are performed. Asymmetry measurements can be combined with knowledge of the target structures to obtain measurements of performance parameters of lithographic process used to form them. Performance parameters that can be measured in this way include for example overlay, focus and dose. Special designs of targets are provided to allow these measurements of different performance parameters to be made through the same basic asymmetry measurement method.

Referring again to FIG. 3(*b*) and the first example illumination mode with rays 30*a*, +1 order diffracted rays from the target grating will enter the objective lens 16 and contribute to the image recorded at sensor 23. When the second illumination mode is used, rays 30*b* are incident at an angle opposite to rays 30*b*, and so the −1 order diffracted rays enter the objective and contribute to the image. Aperture stop 21*a* blocks the zeroth order radiation when using off-axis illumination. As described in the prior publications, illumination modes can be defined with off-axis illumination in X and Y directions.

By comparing images of the target grating under these different illumination modes, asymmetry measurements can be obtained. Alternatively, asymmetry measurements could be obtained by keeping the same illumination mode, but rotating the target. While off-axis illumination is shown, on-axis illumination of the targets may instead be used and a modified, off-axis aperture 21 could be used to pass substantially only one first order of diffracted light to the sensor. In a further example, a pair of off-axis prisms 21*b* are used in combination with an on-axis illumination mode. These prisms have the effect of diverting the +1 and −1 orders to different locations on sensor 23 so that they can be detected and compared without the need for two sequential image capture steps. This technique, is disclosed in the above-mentioned published patent application US2011102753A1, the contents of which are hereby incorporated by reference. 2nd, 3rd and higher order beams (not shown in FIG. 3) can be used in measurements, instead of or in addition to the first order beams. As a further variation, the off-axis illumination mode can be kept constant, while the target itself is rotated 180 degrees beneath objective lens 16 to capture images using the opposite diffraction orders.

In some embodiments of the following disclosure, techniques will be illustrated for measuring focus performance of a lithographic process that uses oblique illumination on a reflective type of patterning device. These techniques may be applied in particular in EUV lithography, where reflective optics in a near-vacuum environment are required. Metrology targets including certain focus metrology patterns will be printed on the substrate, at the same time as product features are printed. Measurement of these printed patterns may be measured using for example diffraction based techniques in the apparatus of FIG. 3. To allow the use of small targets, these measurements may be performed using the dark-field imaging branch of the apparatus. Diffraction-based measurements can also be made using the pupil imaging branch, however. Of course, the apparatus shown in FIG. 3 is only one example of an inspection apparatus and method that may be used to perform measurements. In one alternative, focus measurements may be made using the alignment sensor of the lithographic apparatus (scanner), for example the position sensors PS1, PS2 of FIG. 1.

In the context of lithographic apparatuses working in the DUV wavelength range, targets for diffraction-based focus (DBF) measurements have been designed and used successfully. A known type of DBF target is produced by including sub-segmented features in a grating pattern on the reticle. These features have dimensions below the imaging resolution of the lithographic apparatus, alongside more solid features. Consequently, they do not print as individual features in the resist layer on the substrate, but they influence the printing of the solid features, in a manner that is sensitive to focus error. Specifically, the presence of these features creates an asymmetric resist profile for each line in the grating within the DBF metrology target, with the degree of asymmetry being dependent upon focus. Consequently a metrology tool such as the inspection apparatus of FIG. 3 can measure the degree of asymmetry from a target formed on the substrate, and translate this into the scanner focus.

Unfortunately, the known DBF metrology target designs are not suitable for use in all situations. In EUV lithography, resist film thicknesses are significantly lower than those used in DUV immersion lithography, leading to low diffraction efficiency and difficulty extracting accurate asymmetry information from diffracted radiation in the scatterometer. In addition, since the resolution of the imaging system is inherently higher in EUV lithography, features having dimensions below the printing resolution of DUV immersion lithography become “solid” features printable by EUV lithography. To provide analogous sub-resolution features on an EUV reticle is rather impractical, and/or may violate semiconductor manufacturer’s “design rules”. Such rules are generally established as a means to restrict the feature designs to ensure the printed features conform to their process requirements. In any case, working outside the design rules makes it difficult to simulate the performance of the process on the DBF targets, so that the optimum target design and the calibration of focus measurements becomes a matter of trial-and-error. The desire to conform to design rules applies to DBF targets in DUV lithography, not only EUV lithography. As such, in at least some embodiments, a different diffraction based focus target principle will be disclosed.

Figure 4:
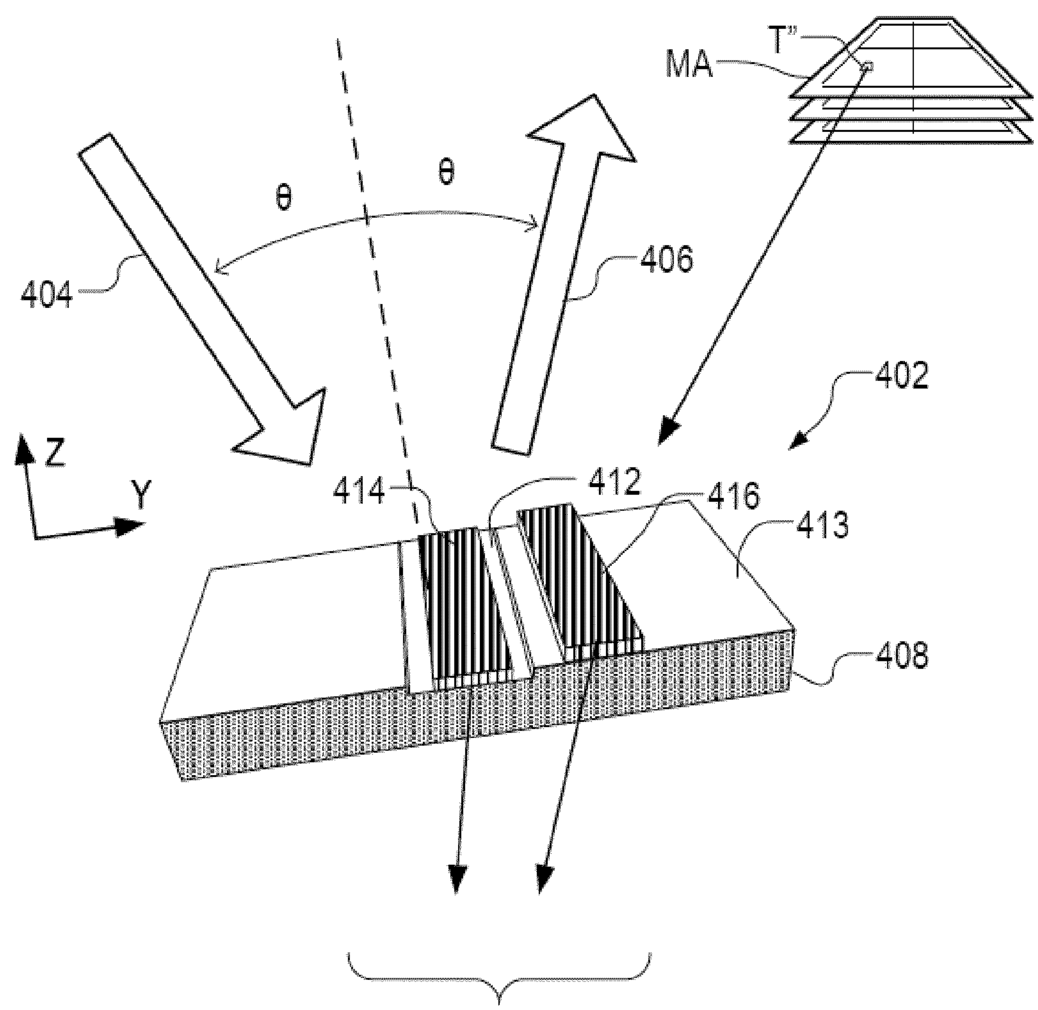
FIG. 4 illustrates the formation of a focus metrology target on a substrate using a reflective patterning device in one embodiment of the present invention.
Figure 4:
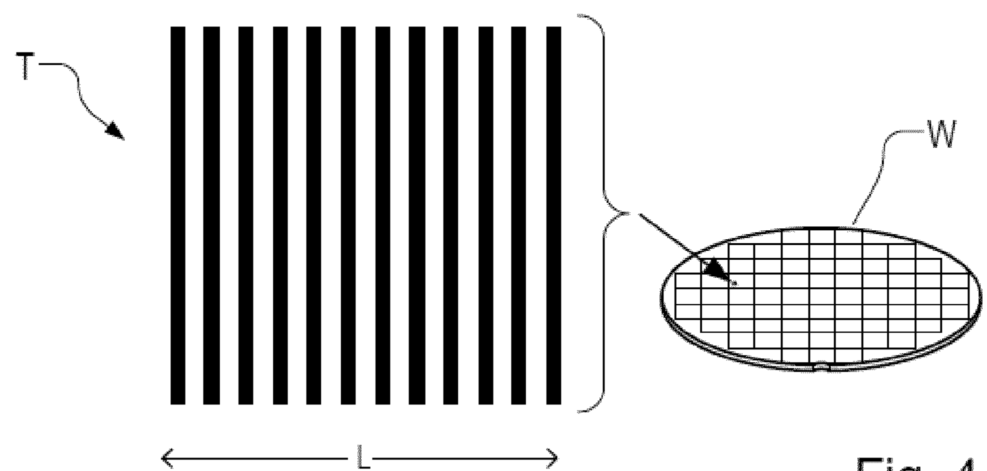

FIG. 4 illustrates the principles of a method of measuring focus performance of a lithographic apparatus according to the present disclosure. In the disclosed method, the lithographic apparatus is used to print at least one focus metrology pattern T on a substrate W. The printed focus metrology pattern T comprises an array of features that is periodic in at least one direction. For the purpose of this example, the focus metrology pattern T is periodic in the Y direction, which corresponds to the scanning direction of the lithographic apparatus. In a lithographic apparatus of the type described, the direction of illumination is at an oblique angle, within the Y-Z plane. The focus metrology pattern T is made periodic in this Y direction, to exploit the asymmetry in the imaging process, caused by this obliqueness of illumination. By measuring asymmetry in the printed focus metrology pattern, for example using an inspection apparatus of the type described above, a measurement of focus performance can be derived. Of course, the target T may have a different form, or be periodic in another direction, particularly when the lithographic apparatus differs from the type described.

Patterning device MA comprises reflective and non-reflective portions to define features of one or more device patterns and one or more metrology patterns. As one type of metrology pattern of interest for the present disclosure, a focus metrology pattern T to be formed on the substrate W is defined by a corresponding pattern T" formed on reflective patterning device MA. An enlarged detail of part of the reticle is shown at 402. The printing operation which transfers this pattern onto a resist layer on substrate W is performed in the lithographic apparatus of FIG. 1 by illuminating the reticle with EUV radiation 404 radiation incident at an oblique angle θ, which may be for example in the range of 5° to 10°. Reflected radiation 406 carrying information of the metrology target pattern (and all the product features desired to be printed on the substrate) enters the projection system PS. The basis of the reticle is a reflective structure 408, which is typically a multilayer structure, adapted to reflect a wavelength of radiation used in the lithographic apparatus. The EUV radiation is typically shorter than 20 nanometers. For example, a wavelength of approximately 13.5 nm is used in current implementations, which are based on a tin plasma radiation source.

It is proposed, in a first main embodiment, to alter the reflectivity characteristics for portions of the patterning device MA. This may comprise locally altering reflectivity characteristics of the reflective structure 408 (multilayer). In particular, an angular reflectivity curve of a locally altered region may be different than the surrounding, nominal area. The multilayer 408 may comprise, for example, 40 to 50 alternating layers of silicon and molybdenum on a substrate.

One method of doing this is to change (or detune) the multilayer pitch. This effectively changes the thickness of the multilayer 408 at these detuned regions. One such detuned region 412 is shown, where the multilayer pitch has been reduced and therefore the multilayer is thinner in this region (the thickness difference is exaggerated for clarity) with respect to the nominal multilayer thickness/pitch. In fact, the thickness difference with respect to nominal may be approximately 7 nm, which is negligible in terms of focus (suppressed by more than a factor of 16 on wafer level) and also implies that the surroundings will be impacted only locally. The detuned multilayer results in the plane-waves of EUV radiation 404 that have, with respect to the mask-normal, either a small angle θ (when the multilayer pitch is smaller then nominal) or large angle θ (when the multilayer pitch is larger than nominal) being damped rather than reflected. In this way a non-telecentric illumination is created.

More specifically, the detuned regions impose an increased non-telecentricity (a first non-telecentricity) to the illumination at substrate level with respect to a nominal amount of non-telecentricity inherent in an off-perpendicular (oblique) reflective system (a second non-telecentricity). It will be appreciated that such reflective systems cannot generate truly telecentric radiation due to the illumination being incident non-perpendicularly on the reticle (the aforementioned oblique angle θ). This increased non-telecentricity can be positive or negative depending on the pitch of the multilayer 408, e.g., is it smaller or larger than nominal. The non-telecentric illumination is used to cause a lateral shift in x and/or y as function of defocus z of the aerial image of a structure on the reticle.

Such a concept is analogous to the Leveling Verification Test (LVT) concept used on other, non-EUV lithographic systems. The LVT test uses a special reticle with glued glass wedges on top, to locally create non-telecentric illumination on a double telecentric lens. This non-telecentric illumination is used to cause a focus dependent shift of the aerial image of an alignment mark situated beneath a glass wedge. By measuring the alignment shift of this defocus mark with respect to a reference mark (imaged without wedge on top), the defocus at the moment of exposure can be determined. The shift is then typically measured by the alignment system present on the lithographic apparatus.

Figure 5:
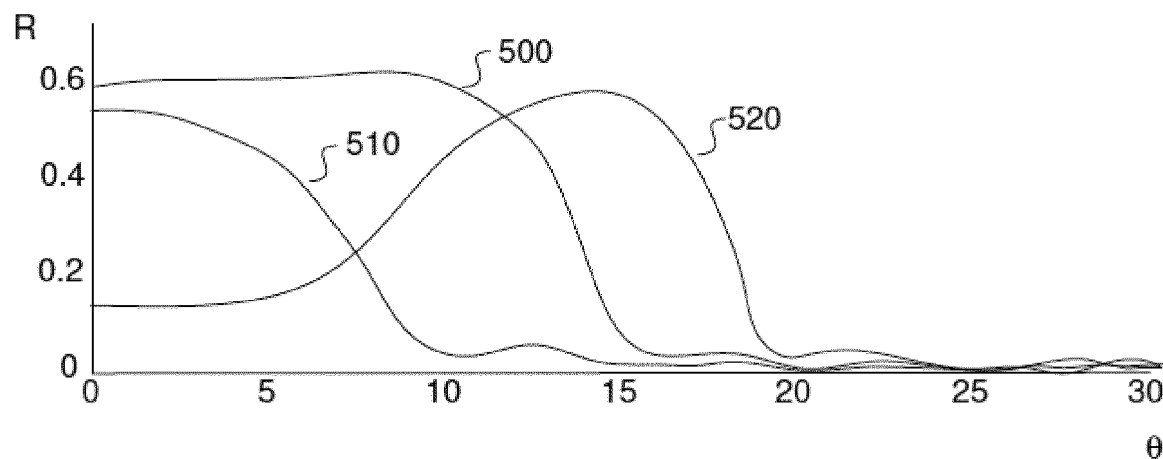
FIG. 5 illustrates is an angular reflectivity curve or plot of reflectivity (y-axis) against angle (x-axis) illustrating the effect of multilayer pitch on the reflectivity characteristics of the multilayer.

FIG. 5 is an angular reflectivity curve which illustrates the effect of the detuning of the multilayer 408 on reflectivity. The angular reflectivity curve is a graph of reflectivity R (where 1 is total reflection) against incidence angle θ on the reticle. Three plots are shown: a first angular reflectivity curve 500 corresponds to the nominal multilayer having a pitch tuned for optimal (e.g., substantially constant) reflectivity over the relevant angle range, i.e., θ between 0 and 11 degrees; a second angular reflectivity curve 510 corresponds to a detuned multilayer having a smaller pitch with respect to the nominal multilayer (in this specific example: 2.5% smaller); and a third angular reflectivity curve 520 corresponds to a detuned multilayer having a larger pitch with respect to the nominal multilayer (in this specific example: 2.5% larger). It can be seen that for the smaller pitch multilayer, the angular reflectivity curve 510 shows radiation incident at angles above 6 degrees being damped, and for the larger pitch multilayer, the angular reflectivity curve 520 shows radiation incident at angles below 6 degrees being damped.

To translate this effect into a focus determination method usable in focus control, it is proposed, in an embodiment, to form a pattern, e.g., a first reticle structure or pattern 414 (e.g., a grating) on the detuned region 412, and form a second (e.g., similar) reticle structure or pattern 416 on the nominal area 413 of the multilayer 408. The first pattern 414 and second pattern 416 may be formed adjacent one another. Each pattern 414, 416 may be formed, for example, of a plurality of periodic absorber structures separated by reflective areas, which form a corresponding target T (e.g., grating) on a substrate W when exposed. The form of target T as shown is purely exemplary, and may in fact take many different forms depending on what apparatus is used to measure them and by which method.

The angular reflectivity curve applicable to the first pattern 414 induces a first non-telecentricity and the angular reflectivity curve applicable to the second pattern 416 induces a second non-telecentricity (which may be a nominal or even negligible non-telecentricity). It can be shown that, due to the difference in angular reflectivity curves applicable to the first pattern 414 and second pattern 416, there will be a focus dependent shift of the first target on the substrate (first printed structure imaged from first pattern 414) with respect to the second target on the substrate (second printed structure imaged from second pattern 416). By measuring this focus dependent shift, the focus may be determined. It should be noted that the detuned region 412 of the multilayer should reflect sufficiently (within the relevant angle range) such that the dose remains sufficient to print features that are slightly larger than at-resolution features (e.g. the DBO pitches—where relevant—of the targets/gratings will still print). In an embodiment, the angular reflectivity curve applicable to the detuned region 412 may result in an expected order of non-telecentricity in the resultant patterned radiation which may be in the region of 50 to 100 mrad, (e.g., for larger features and a deviation of the multilayer pitch in the region of 2 to 3% from nominal).

One method of locally altering the reflectivity of the multilayer may comprise locally heating the multilayer; e.g., by locally heating the backside of the reticle. This can cause a shrinking of the multilayer thickness, and therefore pitch at the heating location. The detuned regions may be small, e.g., in the region of a few μm square; and therefore may be located in a border region and/or scribe lane.

The actual relationship between focus and shift will be dependent on the actual angular reflectivity curve of the detuned region 412 (e.g., the degree of change of multilayer pitch) and the characteristics of illuminations conditions (characteristics of the measurement radiation) when performing the target measurements. As such, for a specified illumination condition, a calibration can be performed. Such a calibration step may be applicable to any of the embodiments disclosed herein. This calibration may comprise measuring (e.g., per slit position) the (relative) pattern-shifts through focus, as there is a predictable, measureable, through-slit shift. V-patterns do not shift at the slit center due to symmetry. At the slit-edge, however, due to the fact that the azimuthal angle differs from 90 degrees, the diffraction is conical. Therefore, V-patterns can also be used to detect focus-variation at the slit-edge.

It is not always desirable to locally alter the multilayer as described in the above embodiment, as such a second main embodiment will now be described, where no detuning of the multilayer is required.

It has already been mentioned that reflective lithography systems have an inherent non-telecentricity on the patterning illumination. It has been observed that this non-telecentricity is dependent on (inter alia) aspects of the absorber layer on the reticle (sometimes referred to as "mask 3D effects"). In particular, it has been observed that the degree of an imposed non-telecentricity to the illumination (i.e., following reflection by the reticle) is dependent on a grating pitch of a grating pattern (or other periodic pattern) in the absorber layer. As such, the grating pitch can be used to effectively tune the degree of non-telecentricity of radiation patterned by the grating pattern. Up to now, the tendency has been to minimize this non-telecentricity by avoiding target pitches which result in increased non-telecentricity, as non-telecentricity is generally undesirable in a lithographic imaging apparatus. As such, these avoided pitches are sometimes referred to as forbidden pitches.

It is proposed in this embodiment to make use of the forbidden pitches to deliberately induce significant non-telecentricity in radiation patterned by patterns having said forbidden pitches. Focus can be measured in a similar manner as already described; e.g., by measuring shift of a first printed structure imaged from a first (e.g., grating) pattern having a pitch tuned to induce a first non-telecentricity (e.g., a forbidden pitch) with respect to a second printed structure imaged from a second pattern having a pitch tuned to minimize non-telecentricity (a second or nominal non-telecentricity). It will be appreciated however, that provided the first non-telecentricity and second non-telecentricity are different, then there is no requirement for either one to comprise a minimal/nominal non-telecentricity.

In this second main embodiment, a calibration is also proposed to calibrate the focus dependency. The focus induced shift will actually be dependent on illumination conditions, absorber type etc., in addition to the grating pitches. As such, any calibration should be performed for a given illumination condition (or conditions) and absorber type etc. in combination with the chosen pitches. The calibration may comprise measuring the focus induced shift (whether in terms of a change in aligned position or an asymmetry) through known focus settings (i.e., known focus-exposure variations) during target printing.

In either of the main embodiments described above, there are a number of different target (printed structure) designs which can be implemented, and which depend on an intended method of measuring focus. One embodiment may measure focus using an alignment sensor of the lithographic apparatus. Such an alignment sensor could be used to directly measure a positional shift between two separate alignment targets formed in a manner described. As such, the two separate alignment targets may comprise a first target (i.e., a first printed structure) printed from a first pattern on a reticle which induces a first non-telecentricity (e.g., by having a forbidden pitch or lying on a detuned region of multilayer) and second target (comprising a second printed structure) printed from a second pattern on a reticle which induces a second non-telecentricity (e.g., by having a nominal (non-forbidden) pitch or lying on a nominal region of multilayer). Such adjacent targets can be assumed to have been subjected to virtually the same lithographic apparatus defocus. Only their mutual shift is relevant (i.e., a relative shift in their aligned positions).

However, focus measurement via pattern shifts by the alignment system may result in a throughput penalty. To avoid this, measurement of focus using the concepts described herein may be performed using a dedicated metrology apparatus (scatterometer) such as that illustrated in FIG. 3. Such a method may measure the focus from a subset of substrates, with focus corrections determined and fed back to the lithographic apparatus accordingly to maintain focus within a specified tolerance. However, suitable targets are required to be compatible with such metrology apparatuses. In particular, it may be preferable to use targets which can be measured using dark-field imaging techniques, which rely on a measurement of target asymmetry in a single target from opposite higher diffraction orders (e.g., +1 and −1) and with the specular (zeroth order) blocked. Therefore, instead of measuring a pattern shift between adjacent targets, the target may be designed such that the structure on the reticle results in an induced focus dependent asymmetry in the target. It should be appreciate however, that other scatterometer metrology methods may be used, such as those typically termed as bright field measurements (imaging of diffraction in the pupil plane, possibly comprising detecting asymmetry in the zeroth order (evanescent order)).

Figure 6:
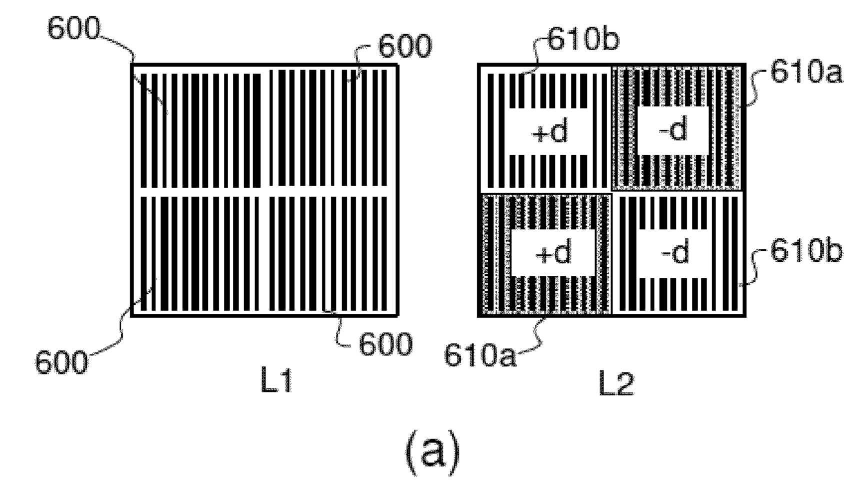
FIG. 6 illustrates a first example of a focus monitoring target suitable for monitoring focus using the inspection apparatus of FIG. 3.
Figure 6:
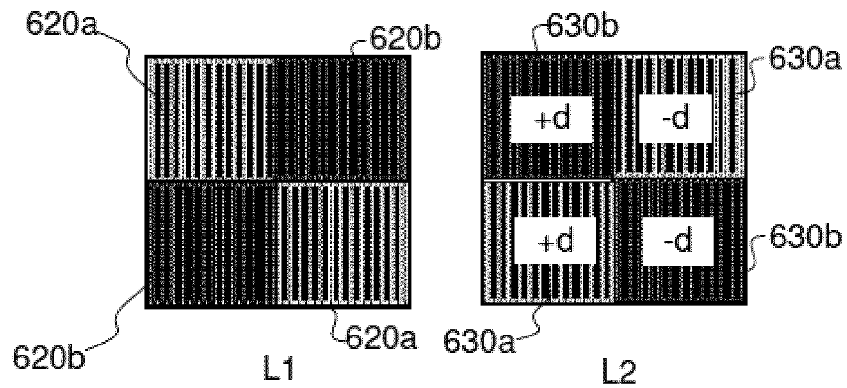

FIG. 6 shows a possible dark-field target design which enables measurement of focus change between two layers. The principle is similar to DBO (diffraction based overlay) targets for measuring overlay. A typical DBO may comprise a first layer having two gratings of a first orientation (e.g., horizontal) and two gratings of a second orientation (e.g., vertical) and a second layer overlaid on the first layer such that each grating is overlaid with a correspondingly oriented grating to form four (compound) sub-targets. Each sub-target has a deliberate positional offset or bias between the layers, with each sub-target of a different orientation having a different bias. More specifically, each bias may have the same magnitude d, such that each pair of sub-targets of a single orientation comprise a sub-target with magnitude +d and a sub-target with magnitude −d.

By comparison, in the embodiment of FIG. 6(*a*), the target may comprise four gratings of a single orientation (e.g., oriented horizontally, vertically or 45 degree diagonally). Layer L1 comprises four gratings 600, all formed with first non-telecentric illumination (e.g., for which the non-telecentricity is minimized or nominally zero). Layer L2 is applied with +d and −d biases as before, and additionally with one each of the +d and −d biased gratings 610*a* being exposed with second non-telecentric illumination e.g., from structures formed on detuned regions of the reticle or having "forbidden pitches" to increase the non-telecentricity (shown shaded), the other two gratings 610*b* in layer L2 being exposed with the first non-telecentric illumination. Measurement of focus can be determined from an intensity asymmetry measurement on the sub-targets having a non-telecentrically exposed grating 610*a*, in a similar manner as typically performed for measurement of diffraction based overlay or earlier diffraction based focus techniques (e.g., using the methodology described in relation to FIG. 3(*b*)). The real overlay can be determined from sub targets having only the first (minimal) non-telecentrically exposed gratings 600, 610*b* in the normal manner Because of their spatial proximity, the sub-targets having the second non-telecentrically exposed grating 610*a* and the sub targets having first non-telecentrically exposed gratings 600, 610*b* will effectively have the same pattern shift such that, when comparing layer L1 and layer L2, the focus determination can be corrected for this real overlay impact.

FIG. 6(*b*) shows a variation which enhances the obtained signal. In this embodiment, all the gratings in both layers L1 and L2 are exposed with the first and second non-telecentric illumination. The four sub-targets comprise: a first sub-target comprising a layer L1 grating exposed via a first detuned region or structure with first forbidden pitch 620*a* (lighter shaded) and a layer L2 grating exposed with a +d offset via a second detuned region or structure with second forbidden pitch 630*b* (darker shaded); a second sub-target comprising a layer L1 grating exposed via a second detuned region or structure with second forbidden pitch 620*b* and a layer L2 grating exposed with a −d offset via a first detuned region or structure with first forbidden pitch 630*a*; a third sub-target comprising a layer L1 grating exposed via a second detuned region or structure with second forbidden pitch 620*b* and a layer L2 grating exposed with a +d offset via a first detuned region or structure with first forbidden pitch 630*a*; and a fourth sub-target comprising a layer L1 grating exposed via a first detuned region or structure with first forbidden pitch 620*a* and a layer L2 grating exposed with a-d offset via a second detuned region or second forbidden pitch 630*b*. The degrees of non-telecentricity associated with the first detuned regions/forbidden pitches and second detuned regions/forbidden pitches are different. In a specific embodiment, the signal may be enhanced by oppositely detuning the multilayer in the +d and −d gratings. For example, the first detuned region may comprise a positively detuned multilayer (increased pitch) and the second detuned region may comprise a negatively detuned multilayer (decreased pitch) relative to nominal. This is analogous to the double-wedge LVT method. Determining the focus from intensity asymmetry measurements of the pair of first and fourth sub-targets; and of the pair of second and third sub-targets enables overlay to be cancelled.

In an embodiment, a single target may be formed which comprises alternating first printed structures and second printed structures. This may enable the determination of focus using a metrology apparatus such as that illustrated in FIG. 3, using a single layer target (i.e., measuring single layer focus).

Figure 7:
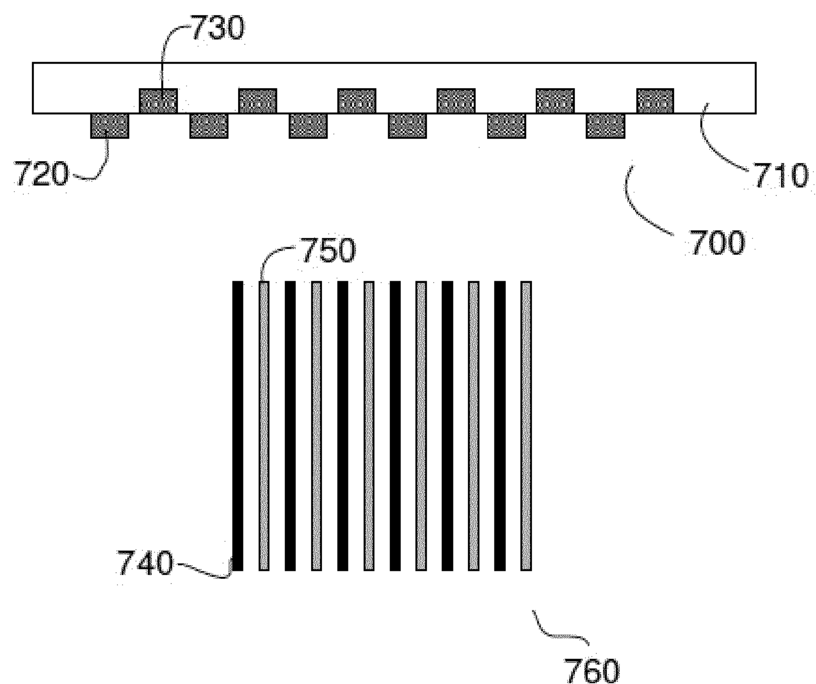
FIG. 7 illustrates a second example of a focus monitoring target, suitable for monitoring focus using the inspection apparatus of FIG. 3.

A first single layer embodiment, is illustrated in FIG. 7. A reticle pattern 700 comprising a combination of absorber features 720 (e.g., absorber lines) and embedded (etched) features 730 (e.g., etched lines) is formed on a reticle. Such a reticle pattern 700 may, for example, be formed on a detuned region 710 of the reticle. In particular the structure may comprise a grating of alternating absorber features 720 and embedded features 730. The normal absorber features 720 induce much more non-telecentricity compared to the embedded features 730, particularly when formed on a detuned region. As a result, first lines 740 (shown darker in the drawing) formed from the absorber features 720 show a significantly greater shift as a function of focus compared to second lines 750 (shown lighter in the drawing) formed from the embedded features 730. Because of this focus-dependent relative shift between first lines 740 and second lines 750, measured asymmetry of such a printed target 760 comprising alternating first lines 750 and second lines 760 will be focus dependent. Therefore focus can be determined using an intensity asymmetry measurement of a single layer target 760 in a similar manner to a DBF measurement.

Figure 8:
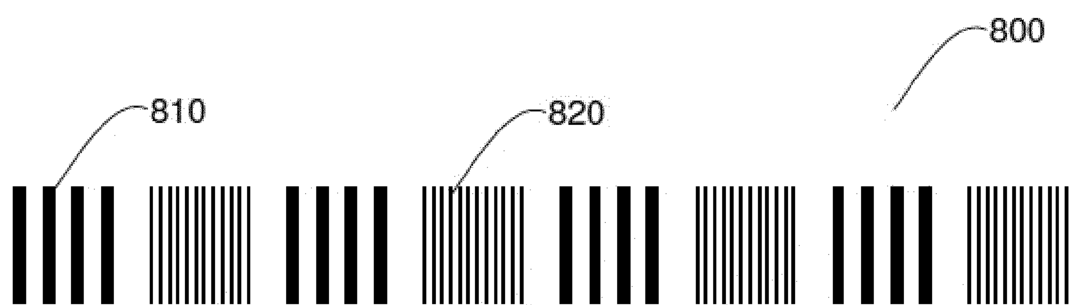
FIG. 8 illustrates a third example of a focus monitoring target, also suitable for monitoring focus using the inspection apparatus of FIG. 3.

FIG. 8 illustrates a further embodiment, which may be implemented within a single layer, and which forms an interlaced target 800. The interlaced target 800 comprises first printed structures 810, each of which is a grating formed via first patterns on a reticle having a first pitch tuned to induce a first non-telecentricity (e.g., a forbidden pitch). The interlaced target 800 further comprises second printed structures 820, each of which is a grating formed via second patterns on a reticle having a second pitch tuned to minimize non-telecentricity (a second or nominal non-telecentricity). As before, the second pitch may simply induce a (measurably) different non-telecentricity compared to the first pitch, rather than minimizing this effect. Such an interlaced target could also be implemented within two layers, with first printed structures 810 in a first layer and second printed structures 820 in a second layer (or vice versa). In a similar manner to target 760, the difference in non-telecentricity between first printed structures 810 and second printed structures 820 results in a focus dependent shift in one with respect to the other and therefore a focus dependent asymmetry in the interlaced target as a whole. As such, focus can be determined from the interlaced target 800 via an intensity asymmetry measurement in a similar manner to a DBF measurement.

Other single-layer focus monitoring solutions may comprise optimizing the accuracy of the positioning of the metrology apparatus sensor, designing a grating having a diffraction spectrum that results in a different non-telecentricity, or having the different features (telecentrically and non-telecentrically exposed) within the field-of-view of the sensor.

One notable feature of all embodiments described herein, is that no special illumination mode is required. As such, normal imaging illumination may be used in formation of the target structures described herein. This means that the target patterns can be included on product reticle and printed on product substrates as part of an actual manufacturing process. In this way, focus from actual product substrates can be measured, from printed structures formed by the same illumination and during the same exposure as the product structures. This can be extended further such that focus may be determined from the actual product structures. Such production structures may be periodic in nature and have an effective pitch that induces increased non-telecentricity with respect to nominal (e.g., production structures having an effective pitch which is, or is close to, a forbidden pitch). The focus could then be measured from the shift of these production structures with respect to nominal (or different) non-telecentricity inducing structures (either dedicated targets or other production structures having a different pitch). In this respect, an additional step may identify such production structures which have a pitch that induces increased non-telecentricity with respect to nominal. A similar principle may comprise measuring focus from a shift of product structures exposed from a detuned region of the multilayer with respect to product structures exposed from a nominal region of the multilayer.

Figure 9:
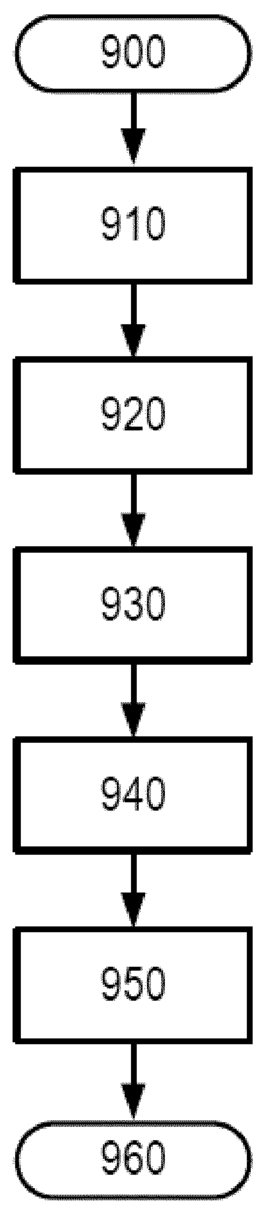
FIG. 9 is a flowchart of a method of monitoring focus according to an embodiment of the invention.

FIG. 9 is a flowchart of the steps of a method for measuring focus performance of a lithographic process according to an exemplary embodiment:

900—Start by defining a product design or metrology wafer design with printed structures, and preparing a suitable set of patterning devices (reticles). The reticles should be designed and prepared according to any of the embodiments described herein. In a first main embodiment the reticle may comprise one or more detuned regions, e.g., having a detuned multilayer, on which a first reticle structure (e.g., focus metrology pattern) is formed by (for example) absorber and one or more second (reference) reticle structures, e.g., a focus metrology pattern on a nominal area of the multilayer, or etched/embedded into the one or more detuned regions. Alternatively, in a second main embodiment, the reticle may comprise first and second patterns, each having a different pitch which induces a different degree of non-telecentricity.

910—In advance of production, make exposures with known focus-exposure variations and measure any corresponding focus-induced shift of the first printed structures corresponding to the first reticle structures relative to second printed structures corresponding to the second reticle structures, to obtain one or more calibration curves. (This may involve an iterative loop of design, exposure and measurement steps.)

920—During production, print one or more first printed structures from said first reticle structures and one or more second printed structures from said second reticle structures, alongside product patterns on a substrate;

930—Measure a positional shift between the first printed structures and the second printed structures. This step may comprise using an alignment sensor to measure a shift between a first target (the first printed structure) and second target (the second printed structure) Alternatively, this step may comprise using a metrology apparatus such as illustrated in FIG. 3(*a*) to measure targets as illustrated in FIG. 6, FIG. 7 and/or FIG. 8 (each comprising examples of said first and second printed structures). Such a method may comprise measuring intensity asymmetry by the following steps:

i. Measure intensity of a portion of the diffraction spectrum of each printed structure using a suitable inspection apparatus (for example the +1 order is a suitable portion of the diffraction spectrum);

ii. Measure intensity of an opposite portion of the diffraction spectrum (for example, −1 order) of each printed structure using the inspection apparatus;

iii. Calculate measurements of asymmetry of one or more printed structures by comparing the intensities (e.g., determining the intensity difference) of the opposite diffraction orders;

940—Using the measurements from step 930, with the calibration curves stored in step 910, calculate focus error at the time of printing the printed structure(s).

950—Use the derived focus measurement in focus setting for exposures on subsequent substrates.

960—End or repeat.

An alternative method for performing focus measurements is based on measuring characteristics of at least two classes of features formed on a substrate, a first class of features associated with reticle features having a first absorber thickness or first position along the optical axis of the reticle and a second class of features associated with reticle features having a second absorber thickness or a second position along the optical axis of the reticle.

Figure 10:
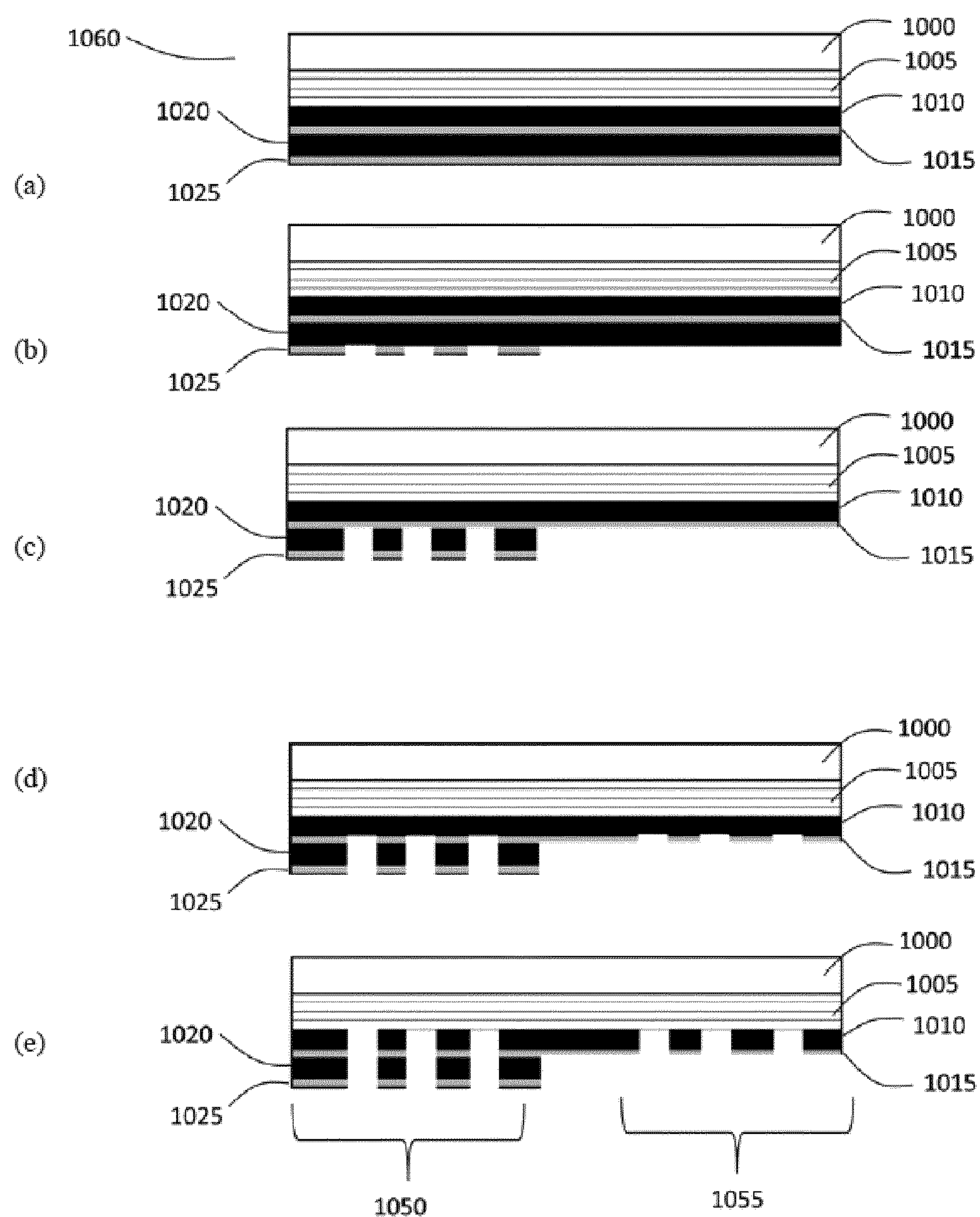
FIG. 10 illustrates a process of patterning a reticle blank according to an embodiment of the invention.

A reticle blank 1060 configured to be used for said alternative method is disclosed in FIG. 10*a*. The reticle blank 1060 comprises a reticle substrate 1000, a first absorber layer (for example Chromium) 1010, a first hard mask layer 1015, a second absorber layer (for example Chromium) 1020 and a second hard mask layer 1025. The reticle blank may be configured for an EUV exposure tool, in which case a multilayer EUV reflective coating (for example a configuration of alternating Molybdenum and Silicon layers) is provided to the reticle substrate. For EUV reticle blanks the first and second absorber layer typically comprise either Chromium (Cr) or Tantalum (compounds). For reticle blanks configured for transmissive patterning the layer 1005 is absent, for DUV reticles no such reflective multilayer coating 1005 is provided. The second hard mask layer 1025 has a different etching selectivity compared to the first hard mask layer 1015. Reticles for transmissive patterning may also be based on Attenuated Phase Shift Mask (Att-PSM) technology in which case the absorber layers 1010 and 1020 are typically based on alternating Molybdenum-Silicon (MoSi) layers.

In an embodiment two classes of reticle features are formed on the reticle blank 1060 using a method comprising multiple steps.

In a first step the second hard mask layer 1025 is patterned using a known reticle blank patterning technique, typically using patterning of a resist layer provided to the first hard mask layer using an e-beam writing tool, followed by a resist development step and a hard mask etching step. The result is shown in FIG. 10*b*; the second hard mask layer 1025 is patterned.

In a second step the second absorber layer is removed (for example using an etching process), giving the patterned reticle blank 1060 as depicted in FIG. 10*c*.

In a third step the first hard mask layer 1015 is patterned using known reticle blank patterning techniques (FIG. 10*d*).

In a fourth step the first absorber layer 1010 is removed (for example using an etching process), giving a patterned reticle blank 1060 according to FIG. 10*e*, comprising a first class of reticle features 1050 (having a large total absorber thickness) and a second class of reticle features 1055 (having a smaller total absorber thickness).

Optionally the remaining parts of the two hard mask layers may be removed using for example an etching process.

The describes process may be extended by patterning more than two classes of reticle features on the reticle blank. This would involve the provision of more than two absorbers layers and more than two hard mask layers, the sequence of patterning being analog to the previously describes four step process.

In an embodiment a reticle is manufactured based on patterning of a reticle blank comprising alternating layers of a hard mask and an absorber layer provided to a reticle substrate. The reticle substrate is provided with an EUV reflecting coating in case the reticle is configured for use within an EUV lithographic apparatus. Subsequent hard mask layers have different etch characteristics (for example a selectivity to a certain etching process). The manufacturing process comprising the following steps: patterning a first hard mask layer, etching an absorber layer until the second hard mask layer is reached, patterning a second hard mask layer and etching an absorber layer until either the reticle substrate, an EUV reflective coating or a third hard mask layer is reached. The process may be continued in case more than two absorber—hard mask layers are provided to the reticle substrate.

Figure 11:
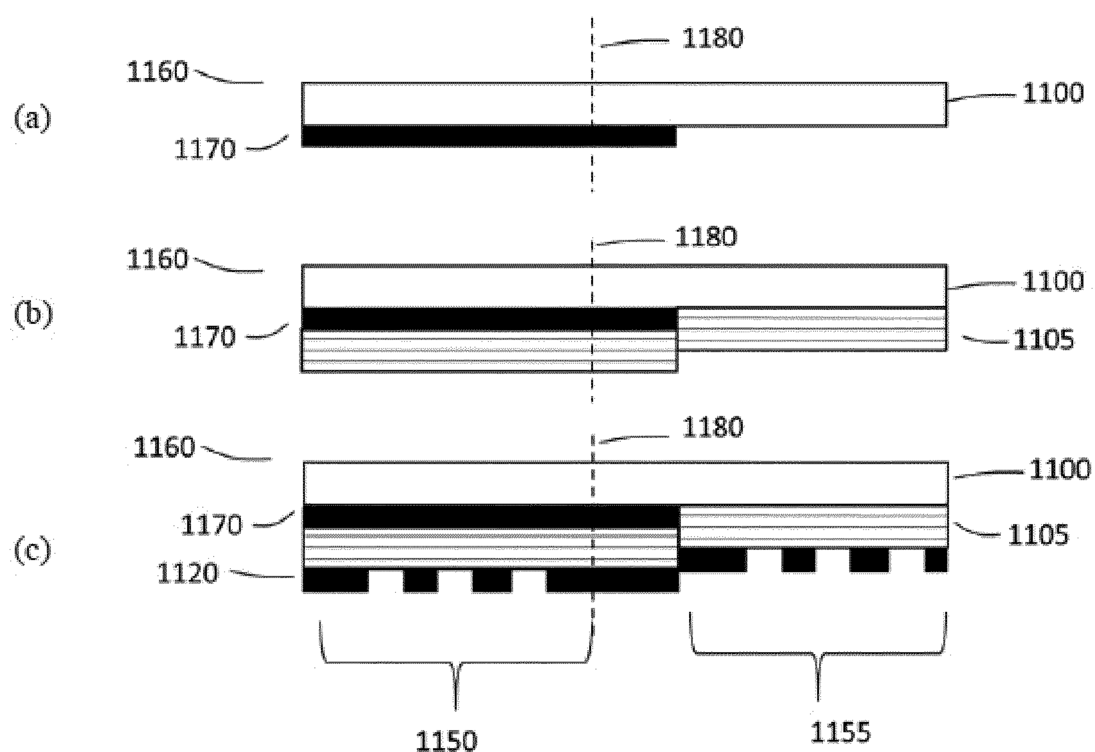
FIG. 11 illustrates a process of patterning a reticle blank according to another embodiment of the invention.

Another method to provide the reticle with two classes of reticle features is depicted in FIG. 11. This method is targeted for use with an EUV reticle 1160, e.g. a reticle comprising an EUV reflective multi-layer coating. In a first step (FIG. 11(*a*)) the reticle substrate 1100 of the reticle is locally provided with a material 1170 (can be any material suitable for local displacement of a multi-layer coating; e.g. the same material as absorber layer 1120, for example Chromium or Tantalum compounds). The material may be provided by any suitable means like coating, sputtering, e-beam assisted deposition and the like. Alternatively a layer of said material 1170 may be provided to the reticle substrate followed by local removal of the material (for example by etching). In a second step (FIG. 11(*b*)) subsequent to the provision of the material 1170 an EUV reflective coating 1105 is provided which is subsequently provided (third step, FIG. 11(*c*)) with an absorber layer 1120 which is patterned using for example a standard lithographic process. The features 1150 are hence provided at an area which is elevated with respect to the features 1155 due to the presence of the material 1170. In this fashion two classes of reticle features 1150 and 1155 are created on the reticle 1160; one class of features 1150 located at a first position along the optical axis 1180 of the reticle 1160 and a second class of features 1155 positioned at a second position along the optical axis 1180 of the reticle 1160.

In an embodiment a reticle is manufactured based on patterning of a reticle blank comprising a reticle substrate which is locally provided with a material 1170, an EUV reflecting layer provided to the reticle substrate and an absorber layer 1120, the reticle being configured for use within an EUV lithographic apparatus. The absorber layer 1120 is patterned at least at a first area of the reticle 1160 being provided with said material 1170 and at a second area of the reticle 1160 where said material 1170 is not provided.

In another embodiment the reticle does not comprise an absorber layer 1120, in which case the reticle features 1150 and 1155 are formed by patterning of the EUV reflective layer 1105.

The reticle comprising the at least two classes of reticle features 1050/1150 and 1055/1155 may be used in a lithographic process of patterning substrates (wafers), at least two classes of features will be then be formed on the substrate (not shown); a first class of features being exposed at the substrate at a first focus setting and a second class of features being exposed at the substrate at a second focus setting. The effect of the different absorber thicknesses or position along the optical axis of the reticle being that the image of the first class of reticle features will be located at a different focus level compared to the image of the second class of reticle features. The projection lens of a lithographic apparatus typically has a longitudinal magnification of ~1/12, hence a difference in absorber thickness or position along the optical axis of the reticle of 500 nm will typically cause a difference in the focal position of the first and second class of features of ~40 nm. In practice the absorber layers typically have a thickness between 100 um and 1000 um, hence causing a difference of focal position between the first and second class of features between 8 and 80 nm.

In case of an EUV reticle the difference in focus position between the first and second classes of features is roughly doubled, as the reflective nature of the reticle basically causes a doubling of the optical path length of the light reflected by the first class of reticle feature and the second class of reticle features. Hence a typical difference in focus position between the first and second class of reticle features is then between 16 um and 160 um.

When a characteristic (for example the Critical Dimension 'CD') is measured (using a Scatterometer or a Scanning Electron Microscope) is determined for said first and said second class of features it is possible to determine the focus performance of the lithographic apparatus at the moment of exposing the reticle features to the substrate. In general a characteristic like CD depends on the focus performance 'Focus' in a quadratic fashion (a so-called "Bossung" curve): CD=CDo+c*Focus^2; CDo being the nominal CD, 'c' being a parameter associated with a (known) curvature of the Bossung. When measuring the CD for the first class of features (CD1) and the second class of features (CD2), while the difference in absorber thickness has been tuned to cause a +40 nm shift in the focus setting, the value of the Focus performance can be isolated: Focus=(CD2−CD1)/(80*c)−20. So in case CD1 and CD2 are equal it can be deduced that the focus performance of the lithographic apparatus is such that nominally reticle features are imaged at a focus position of −20 nm at substrate level.

Instead of CD measurements any metric demonstrating a sufficiently strong dependency to the focus setting may be utilized to perform the method of determining said focus performance. For example diffractive measurements performed on the features on the substrate may be performed, wherein for example the intensity or energy comprised within the diffractive orders emanating from the features may be used as a metric being dependent on the focus setting.

In an embodiment a method is provided for exposing a first reticle feature and a second reticle feature, said first and second reticle feature having a different absorber thickness or a different position along an optical axis of the reticle, using a lithographic apparatus to a substrate, the substrate subsequently measured using a metrology tool, wherein the measurement includes measurement of a characteristic of a first feature formed by exposure of the first reticle feature and measurement of the characteristic of a second feature formed by exposure of the second reticle feature, the method further comprising determining a focus performance of the lithographic apparatus based on the characteristic of the first feature and the characteristic of the second feature.

Further embodiment of the invention are disclosed in a first list of numbered clauses:

1. A method of measuring focus performance of a lithographic apparatus, the method comprising:
   (a) printing one or more printed structures on a substrate using the lithographic apparatus, said one or more printed structures comprising first printed structures and second printed structures, said first printed structures being printed by illumination having a first non-telecentricity and said second printed structures being printed by illumination having a second non-telecentricity, different to said first non-telecentricity;
   (b) measuring a focus dependent parameter related to a focus-dependent positional shift between said one or more first printed structures and said one or more second printed structures on said substrate; and
   (c) deriving a measurement of focus performance based at least in part on the focus dependent parameter measured in step (b).
2. A method as defined in clause 1, wherein said printing step comprises using at least one reflective patterning device to pattern said illumination, said reflective patterning device comprising one or more first reticle structures for printing said first printed structures with said first non-telecentricity and one or more second reticle structures for printing said second printed structures with said second non-telecentricity.
3. A method as defined in clause 2, wherein a first angular reflectivity curve of the one or more first reticle structures is different from a second angular reflectivity curve of the one or more second reticle structures.
4. A method as defined in clause 3, wherein each angular reflectivity curve describes a variation of reflectivity of the corresponding structure and/or region with angles of incidence on said structure and/or region of patterning radiation used in said printing of the one or more printed structures; wherein said patterning radiation is used to print said one or more first printed structures and said one or more second printed structures.
5. A method as defined in clause 3 or 4, wherein said reflective patterning device comprises a reflective multilayer surface, having at least one detuned region of said reflective multilayer surface which has an altered multilayer pitch such that the angular reflectivity curve of the detuned region is different to a nominal region of the reflective multilayer surface.
6. A method as defined in clause 5, wherein said one or more first reticle structures are located on the detuned region of said patterning device and said one or more second reticle structures are located on the nominal region of said patterning device.

7. A method as defined in clause 6, wherein said measuring step is performed using an alignment sensor of the lithographic apparatus, the first printed structure comprising a first alignment target and said second printed structure comprising a second alignment target.
8. A method as defined in clause 5, wherein said measuring step is performed using a metrology apparatus which measures intensity asymmetry in corresponding higher orders of diffracted radiation and/or in the zero order diffracted radiation, said intensity asymmetry corresponding to asymmetry in a printed structure being measured.
9. A method as defined in clause 8, wherein said one or more first reticle structures and one or more second reticle structures are both located on the detuned region, said one or more first reticle structures being formed of an absorber material on the reticle's reflective surface and said one or more second reticle structures being embedded in the reticle's reflective surface.
10. A method as defined in clause 8, wherein said one or more first reticle structures are printed on the substrate in a first layer and said one or more second reticle structures are printed on the substrate in a second layer, overlaying said first layer to form a printed metrology target which has focus dependent asymmetry.
11. A method as defined in clause 10, wherein said one or more first reticle structures are located on the detuned region of a first patterning device and said one or more second reticle structures are located on the nominal region of a second patterning device.
12. A method as defined in clause 10, wherein said one or more first reticle structures are located on a first detuned region of a first patterning device and said one or more second reticle structures are located on a second detuned region of a second patterning device; and wherein said first detuned region has a different angular reflectivity curve to said second detuned region.
13. A method as defined in clause 11 or 12, wherein said second printed structures are overlaid said first printed structures with a deliberate positional bias to enable measurement and/or cancellation of overlay.
14. A method as defined in any of clauses 5 to 13, wherein the angular reflectivity curve of the nominal region is shows less variation with angle of incidence over a range of angles of incidence used in printing of said one or more printed structures compared to the angular reflectivity curve(s) of the one or more nominal regions.
15. A method as defined in clause 2, wherein said one or more first reticle structures comprise a first periodic structure having a first pitch which induces said first non-telecentricity and said one or more second reticle structures comprise a second periodic structure having a second pitch which induces said second non-telecentricity.
16. A method as defined in clause 15, wherein said one or more first reticle structures comprise a plurality of periodic first reticle structures each having said first pitch and said one or more second reticle structures comprise a plurality of periodic second reticle structures each having said second pitch; and step (a) comprises forming a single printed metrology target having focus dependent asymmetry, and which comprises a plurality of first periodic printed structures, each of which corresponds to one of said periodic first reticle structures, and a plurality of second periodic printed structures, each of which corresponds to one of said periodic second reticle structures, said first periodic printed structures alternating with said second periodic printed structures.
17. A method as defined in clause 16, wherein each of said periodic printed structures comprise a grating, such that said printed metrology target comprises said first gratings alternating with said second gratings.
18. A method as defined in clause 15, wherein said one or more first reticle structures form a first periodic structure and said one or more second reticle structures form a second periodic structure, individual elements of said first periodic structure being interlaced with individual elements of said first periodic structure such that said first periodic structure and second period structure form a single printed metrology target in step (a) comprising said one or more printed structures and which has focus dependent asymmetry.
19. A method as defined in clause 18, wherein said one or more first reticle structures are formed of an absorber material on the reticle's reflective surface and said one or more second reticle structures are embedded in the reticle's reflective surface.
20. A method as defined in any of clauses 15 to 19, wherein said one or more first reticle structures and said one or more second reticle structures are printed on the substrate in a single layer.
21. A method as defined in clause 18, wherein said one or more first reticle structures are printed on the substrate in a first layer and said one or more second reticle structures are printed on the substrate in a second layer, overlaying said first layer to form a printed metrology target which has focus dependent asymmetry.
22. A method as defined in clause 21, wherein said second printed structures are overlaid said first printed structures with a deliberate positional bias to enable measurement and/or cancellation of overlay.
23. A method as defined in any of clauses 15 to 22, wherein said measuring step is performed using a metrology apparatus which measures intensity asymmetry in corresponding higher orders of diffracted radiation and/or in the zero order diffracted radiation, said intensity asymmetry corresponding to asymmetry in a printed structure being measured.
24. A method as defined in clause 15, wherein said measuring step is performed using an alignment sensor of the lithographic apparatus, the first printed structure comprising a first alignment target and said second printed structure comprising a second alignment target.
25. A method as defined in any preceding clause, comprising an initial calibration stage to determine the relationship between the focus dependent parameter and focus for the particular lithographic apparatus settings and patterning device used in step (b).
26. A method as defined in any preceding clause, wherein said printing step is performed as part of a manufacturing process on a production substrate which simultaneously prints product structures which form part of functional integrated circuits.
27. A method as defined in clause 26, wherein said first printed structures and/or said second printed structures comprise product structures.
28. A method as defined in clause 27, comprising the step of identifying suitable product structures to be said first printed structures and/or said second printed structures due to their inducing suitable non-telecentricity.
29. A reflective patterning device comprising one or more first reticle structures and one or more second reticle structures, wherein a first non-telecentricity induced by said first reticle structures is different to a second non-telecentricity induced by said second reticle structures.

30. A reflective patterning device as defined in clause 29, comprising one or more first reticle structures and one or more second reticle structures, wherein a first angular reflectivity curve of the one or more first reticle structures is different from a second angular reflectivity curve of the one or more second reticle structures.

31. A reflective patterning device as defined in clause 30, wherein each angular reflectivity curve describes a variation of reflectivity of the corresponding structure and/or region with angles of incidence on said structure and/or region of patterning radiation used in said printing of the one or more printed structures; wherein said patterning radiation is used to print said one or more first printed structures and said one or more second printed structures.

32. A reflective patterning device as defined in clause 30 or 31, comprising a reflective multilayer surface, having at least one detuned region of said reflective multilayer surface which has an altered multilayer pitch such that the angular reflectivity curve of the detuned region is different to a nominal region of the reflective multilayer surface.

33. A reflective patterning device as defined in clause 29, wherein said one or more first reticle structures comprise a first periodic structure having a first pitch which induces said first non-telecentricity and said one or more second reticle structures comprise a second periodic structure having a second pitch which induces said second non-telecentricity.

34. A reflective patterning device as defined in clause 33, wherein said one or more first reticle structures comprise a plurality of periodic first reticle structures and said one or more second reticle structures comprise a plurality of periodic second reticle structures alternating with said periodic first reticle structures.

35. A reflective patterning device as defined in clause 33, wherein said one or more first reticle structures form a first periodic structure and said one or more second reticle structures form a second periodic structure, individual elements of said first periodic structure being interlaced with individual elements of said first periodic structure.

36. A reflective patterning device as defined in clause 35, wherein said one or more first reticle structures are formed of an absorber material on the reticle's reflective surface and said one or more second reticle structures are embedded in the reticle's reflective surface.

37. A reflective patterning device as defined in clause 36, comprising a reflective multilayer surface, having at least one detuned region of said reflective multilayer surface which has an altered multilayer pitch such that the angular reflectivity curve of the detuned region is different to a nominal region of the reflective multilayer surface, and wherein said more first reticle structures and said one or more second reticle structures are formed on the detuned region.

38. A reflective patterning device as defined in any of clauses 29 to 33, wherein the one or more first reticle structures corresponds to a first alignment target and the one or more second reticle structures corresponds to a second alignment target.

39. A reflective patterning device as defined in any of clauses 29 to 38 further comprising production reticle structures for printing production substrate structures which form part of functional integrated circuits on a production substrate.

40. A metrology apparatus for measuring a parameter of a lithographic process, the metrology apparatus being operable to perform steps (b) and (c) of the method of any of clauses 1 to 26.

41. A lithographic system comprising:
a lithographic apparatus comprising:
a reflective patterning device;
an illumination optical system arranged to illuminate the reflective patterning device;
a projection optical system arranged to project an image of the patterning device onto a substrate; and
a metrology apparatus according to clause 40;
wherein the lithographic apparatus is arranged to use the measurement of focus performance derived by the metrology apparatus when applying the pattern to further substrates.

42. A lithographic system as defined in clause 41 wherein the reflective patterning device comprises the reflective patterning device as defined in any of clauses 29 to 39.

43. A computer program comprising processor readable instructions which, when run on suitable processor controlled apparatus, cause the processor controlled apparatus to perform steps (b) and/or (c) the method of any of clauses 1 to 26.

44. A method of manufacturing devices wherein a device pattern is applied to a series of substrates using a lithographic process, the method including:
using the method of any of clauses 1 to 26 to measure focus performance of the lithographic process, and
controlling the lithographic process for later substrates in accordance with the measured focus performance.

45. A method of determining focus performance of a lithographic apparatus, the method comprising:
(a) obtaining a positional shift between one or more first printed structures and one or more second printed structures on a substrate, the first printed structures being printed using the lithographic apparatus at an illumination setting having a first non-telecentricity and the second printed structures being printed at an illumination setting having a second non-telecentricity, different to said first non-telecentricity; and
(b) deriving the focus performance based at least in part on the positional shift.

46. A method of determining focus performance of a lithographic apparatus, the method comprising:
(a) obtaining measurement data of a substrate patterned by the lithographic apparatus using the reflective patterning device of clause 29, the measurement data comprising first data associated with the first structures and second data associated with the second structures; and
(b) deriving the focus performance based on the first data and the second data.

Further embodiments of the invention are disclosed in a second list of numbered clauses:

1. A reticle blank comprising a reticle substrate being provided with a configuration of alternating hard mask and absorber layers, wherein a first type of hard mask layer is alternated with a second type of hard mask layer, the first type of hard mask layers having different etch characteristics from the second type of hard mask layers.
2. The reticle blank of clause 1, wherein the reticle substrate is provided with an EUV reflecting layer.
3. The reticle blank of clause 2, wherein the EUV reflective layer comprises a Molybdenum-Silicon (MoSi) multilayer.
4. The reticle blank of clause 1, wherein the reticle is an attenuated Phase Shift Mask.
5. The reticle blank of clause 4, wherein one or more of the absorber layers comprise a Molybdenum-Silicon multilayer layer.

6. The reticle blank of any preceding clause, wherein one or more of the absorber layers comprise chromium.
7. The reticle blank of any of clauses 1 to 3, wherein one or more of the absorber layers comprise Tantalum.
8. The reticle blank of any preceding clause, wherein the thickness of the one or more absorber layers is between 200 um and 1000 um.
9. The reticle blank of any preceding clause comprising two absorber layers and two hard mask layers.
10. A method of manufacturing a reticle comprising at least two classes of reticle features, the method comprising:
   obtaining a reticle blank according to any preceding clause;
   patterning a first hard mask layer;
   etching a first absorber layer;
   patterning a second hard mask layer; and
   etching a second absorber layer, wherein a first class of reticle features is associated with the patterning of the first hard mask layer and a first absorber thickness and a second class of reticle features is associated with the patterning of the second hard mask layer and a second absorber thickness being smaller than the first absorber thickness.
11. A reticle comprising a first class of reticle features having a first absorber thickness and a second class of reticle features having a second absorber thickness being smaller than the first absorber thickness.
12. The reticle according to clause 11, wherein the first class of reticle features comprise a pattern formed in at least two alternating absorber and hard mask layers and the second class of reticle features comprise a pattern formed in a single absorber and hard mask layer.
13. A reticle blank comprising a reticle substrate and an EUV reflecting layer characterized in that the reticle blank further comprises a material locally provided between the reticle substrate and the EUV reflecting layer, wherein the material is suitable to create a difference in elevation between a first area of the reticle blank and a second area of the reticle blank.
14. The reticle blank according to clause 11, further comprising an absorber layer provided on top of the EUV reflecting layer.
15. The reticle blank according to clause 13 or 14, wherein the material is Chromium or a Tantalum compound.
16. A reticle comprising a first class of reticle features having a first position along an optical axis of the reticle and a second class of reticle features having a second position along the optical axis of the reticle.
17. The reticle according to clause 16 comprising the reticle blank of clause 13-15, wherein the first class of reticle features are located at a position associated with the first area and the second class of reticle features are located at a position associated with the second area.
18. A method of determining the focus performance of a lithographic apparatus, the method comprising:
   obtaining first measurement data associated with one or more first features on a substrate patterned by the lithographic apparatus using the reticle according to any of clauses 11, 12, 16, 17, the first features associated with the first class of reticle features;
   obtaining second measurement data associated with one or more second features on the substrate patterned by the lithographic apparatus using the reticle according to any of clauses 11, 12, 16, 17, the second features associated with the second class of reticle features; and
   determining the focus setting based on the first and second measurement data.
19. The method of clause 18, wherein the first and second measurement data comprise at least one CD measurement.
20. The method of clause 18, wherein the first and second measurement data comprise at least one measurement of one or more intensities or energies of one or more orders comprises within a measured diffraction spectrum.
21. The method of clause 19, wherein the focus setting is determined based on subtracting the first measurement data from the second measurement data.
22. A computer program comprising processor readable instructions which, when run on suitable processor controlled apparatus, cause the processor controlled apparatus to perform the method of any of clauses 10, 18-21.
23. A computer system configured to executed the computer program according to clause 22.
24. A lithographic apparatus comprising the computer system of clause 23.
25. A metrology system comprising the computer system of clause 23.
26. A reticle blank comprising a reticle substrate and an EUV reflecting layer characterized in that the reticle blank further comprises a locally provided material between the reticle substrate and the EUV reflecting layer, wherein the material is suitable for creating a difference in elevation between a first area of the reticle blank and a second area of the reticle blank.
27. A reticle comprising the reticle blank of clause 26 and further comprising a first class of reticle features located at a position associated with the first area and a second class of reticle features located at a position associated with the second area.
28. A method of determining focus performance of a lithographic apparatus, the method comprising:
   obtaining first measurement data associated with one or more first features on a substrate patterned by the lithographic apparatus using the reticle according to clause 27, the first features associated with the first class of reticle features;
   obtaining second measurement data associated with one or more second features on the substrate patterned by the lithographic apparatus using the reticle according to clause 27, the second features associated with the second class of reticle features; and determining the focus setting based on the first and second measurement data.

In conclusion, a method of manufacturing devices using the lithographic process can be improved by performing focus measurement methods as disclosed herein, using it to measure processed substrates to measure parameters of performance of the lithographic process, and adjusting parameters of the process (particularly focus) to improve or maintain performance of the lithographic process for the processing of subsequent substrates.

While the target structures including and focus metrology patterns described above are metrology targets specifically designed and formed for the purposes of measurement, in other embodiments, properties may be measured on targets which are functional parts of devices formed on the substrate. Many devices have regular, grating-like structures. The terms "metrology pattern" and "metrology target" and the like as used herein do not require that the structure has been provided specifically for the measurement being performed.

The substrates on which these metrology patterns are formed may be production wafers or experimental wafers in product development. They may also be dedicated metrology wafers, for example monitor wafers which are processed intermittently as part of an advance process control (APC) mechanism.

In association with the physical grating structures defining the focus metrology targets as realized on substrates and patterning devices, an embodiment may include a computer program containing one or more sequences of machine-readable instructions describing a method of designing focus metrology patterns, metrology recipes and/or controlling the inspection apparatus to implement the illumination modes and other aspects of those metrology recipes. This computer program may be executed for example in a separate computer system employed for the design/control process. As mentioned, calculations and control steps may be wholly or partly performed within unit PU in the apparatus of FIG. 3, and/or the control unit LACU of FIG. 2. There may also be provided a data storage medium (e.g., semiconductor memory, magnetic or optical disk) having such a computer program stored therein.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The breadth and scope of the present invention should not be limited by any of the above-described exemplary embodiments, but should be defined only in accordance with the following claims and their equivalents.

The invention claimed is:

1. A method of measuring focus performance of a lithographic apparatus, the method comprising:

printing one or more printed structures on a substrate using the lithographic apparatus, the one or more printed structures comprising one or more first printed structures and one or more second printed structures, the one or more first printed structures being printed by illumination having a first non-telecentricity and the one or more second printed structures being printed by illumination having a second non-telecentricity, different to the first non-telecentricity, wherein the printing is performed using a reflective reticle having one of a first structure or a second structure formed in a detuned region of the reflective reticle that is thinner than a nominal thickness of the reflective reticle;

measuring a focus dependent parameter related to a focus-dependent positional shift between the one or more first printed structures and the one or more second printed structures on the substrate;

deriving a measurement of focus performance based at least in part on the measured focus dependent parameter; and wherein the reflective reticle has at least one reflective patterning device to pattern the illumination, the reflective patterning device comprising one or more first reticle structures for printing the one or more first printed structures with the first non-telecentricity and one or more second reticle structures for printing the one or more second printed structures with the second non-telecentricity.

2. The method of claim 1, wherein a first angular reflectivity curve of the one or more first reticle structures is different from a second angular reflectivity curve of the one or more second reticle structures, wherein each angular reflectivity curve describes a variation of reflectivity of the corresponding structure and/or region with angles of incidence on the structure and/or region of patterning radiation used in the printing of the one or more first and second printed structures, and wherein the patterning radiation is used to print the one or more first printed structures and the one or more second printed structures.

3. The method of claim 1, wherein the one or more first reticle structures comprise a first periodic structure having a first pitch that induces the first non-telecentricity and the one or more second reticle structures comprise a second periodic structure having a second pitch that induces the second non-telecentricity.

4. The method of claim 3, wherein the one or more first reticle structures comprise a plurality of periodic first reticle structures each having the first pitch and the one or more second reticle structures comprise a plurality of periodic second reticle structures each having the second pitch; and the printing further comprises forming a single printed metrology target having focus dependent asymmetry, and which comprises a plurality of first periodic printed structures, wherein each of the plurality of first periodic printed structures corresponds to one of the periodic first reticle structures, and a plurality of second periodic printed structures, wherein each of the plurality of second periodic printed structures corresponds to one of the periodic second reticle structures, the first periodic printed structures alternating with the second periodic printed structures, and wherein each of the periodic printed structures comprises a grating, such that the printed metrology target comprises the first gratings alternating with the second gratings.

5. The method of claim 3, wherein the one or more first reticle structures form a first periodic structure and the one or more second reticle structures form a second periodic structure, individual elements of the first periodic structure being interlaced with individual elements of the second periodic structure such that the first periodic structure and second periodic structure form a single printed metrology target in the printing of the one or more printed structures and that has focus dependent asymmetry, and wherein the one or more first reticle structures are formed of an absorber material on the reticle's reflective surface, and the one or more second reticle structures are embedded in the reticle's reflective surface.

6. The method of claim 3, wherein the one or more first reticle structures and the one or more second reticle structures are printed on the substrate in a single layer.

7. A non-transitory computer readable medium comprising processor readable instructions which, when run on suitable processor controlled apparatus, cause the processor controlled apparatus to perform the method of claim 1.

8. A method of manufacturing devices wherein a device pattern is applied to a series of substrates using a lithographic process, the method including:

using the method of claim 1, to measure focus performance of the lithographic process; and controlling the lithographic process for later substrates in accordance with the measured focus performance.

9. A reflective patterning device comprising:

one or more first reticle structures on a reflective substrate; and one or more second reticle structures on the reflective substrate, wherein a first non-telecentricity induced by the first reticle structures is different to a second non-telecentricity induced by the second reticle structures, and wherein one of the one or more first reticle structures or the one or more second reticle structures is formed in a detuned region of the reflective substrate that is thinner than a nominal thickness of the substrate.

10. A method of determining focus performance of a lithographic apparatus, the method comprising:

obtaining measurement data of a substrate patterned by the lithographic apparatus using the reflective patterning device of claim 9, the measurement data comprising first data associated with the first structures and second data associated with the second structures; and deriving the focus performance based on the first data and the second data.

11. A metrology apparatus for measuring a parameter of one or more printed structures on a substrate formed by a lithographic process, the one or more printed structures comprising one or more first printed structures and one or more second printed structures, the one or more first printed structures being printed using a reflective reticle having one of a first structure or a second structure formed in a detuned region of the reflective reticle that is thinner than a nominal thickness of the reflective reticle, wherein the reflective reticle has at least one reflective patterning device to pattern the illumination, the reflective patterning device comprising one or more first reticle structures for printing one or more first printed structures with a first non-telecentricity and one or more second reticle structures for printing one or more second printed structures with a second non-telecentricity, different to the first non-telecentricity, the metrology apparatus comprising:

an illumination branch configured to illuminate the one or more first printed structures and one or more second printed structures;

a detection branch configured to measure a focus dependent parameter related to a focus-dependent positional shift between the one or more first printed structures and the one or more second printed structures on the substrate, wherein one of the one or more first printed structures or the one or more second printed structures is formed using one of the one or more first reticle structures or the one or more second reticle structures is formed in the detuned region of the reflective reticle; and a processor configured to derive a measurement of focus performance based at least in part on the measured focus dependent parameter.

12. A lithographic system comprising:

a lithographic apparatus comprising:

a reflective patterning device;

an illumination optical system arranged to illuminate the reflective patterning device;

a projection optical system arranged to project an image of the patterning device onto a substrate; and the metrology apparatus of claim 11;

wherein the lithographic apparatus is arranged to use the measurement of focus performance derived by the metrology apparatus when applying the pattern to further substrates.

* * * * *